United States Patent
Chang et al.

(10) Patent No.: US 12,193,204 B2
(45) Date of Patent: Jan. 7, 2025

(54) MEMORY DEVICES AND METHODS OF MANUFACTURING THEREOF

(71) Applicant: Taiwan Semiconductor Manufacturing Company, Ltd., Hsinchu (TW)

(72) Inventors: Meng-Sheng Chang, Chubei (TW); Chia-En Huang, Xinfeng Township (TW); Yi-Hsun Chiu, Zhubei (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 56 days.

(21) Appl. No.: 18/157,461

(22) Filed: Jan. 20, 2023

(65) Prior Publication Data

US 2023/0156996 A1    May 18, 2023

Related U.S. Application Data

(63) Continuation of application No. 17/222,740, filed on Apr. 5, 2021, now Pat. No. 11,563,014, which is a
(Continued)

(51) Int. Cl.
*H10B 10/00* (2023.01)
*G11C 11/40* (2006.01)
(Continued)

(52) U.S. Cl.
CPC ............ *H10B 10/12* (2023.02); *G11C 11/412* (2013.01); *H01L 29/0665* (2013.01); *H01L 29/0847* (2013.01)

(58) Field of Classification Search
None
See application file for complete search history.

(56) References Cited

U.S. PATENT DOCUMENTS 5,777,920 A * 7/1998 Ishigaki .............. H01L 27/0629
                                                              365/182
7,829,942 B2 * 11/2010 Kawasumi ............. H10B 10/12
                                                             257/E27.098
(Continued)

FOREIGN PATENT DOCUMENTS

| KR | 2017010344 A | 2/2016 |
| KR | 20180110797 A | 3/2017 |
| KR | 20190032146 A | 3/2019 |

OTHER PUBLICATIONS

Korean Patent Rejection Decision on KR App. Ser. No. 10-2020-0075699 dated Nov. 30, 2021 (4 pages).
(Continued)

*Primary Examiner* — Tan T. Nguyen
(74) *Attorney, Agent, or Firm* — FOLEY & LARDNER LLP

(57) ABSTRACT

A memory cell is disclosed. The memory cell includes a first transistor. The first transistor includes a first conduction channel collectively constituted by one or more first nanostructures spaced apart from one another along a vertical direction. The memory cell includes a second transistor electrically coupled to the first transistor in series. The second transistor includes a second conduction channel collectively constituted by one or more second nanostructures spaced apart from one another along the vertical direction. At least one of the one or more first nanostructures is applied with first stress by a first metal structure extending, along the vertical direction, into a first drain/source region of the first transistor.

20 Claims, 24 Drawing Sheets

Related U.S. Application Data continuation of application No. 16/786,510, filed on Feb. 10, 2020, now Pat. No. 10,971,505.

(51) Int. Cl.
*G11C 11/412* (2006.01)
*H01L 29/06* (2006.01)
*H01L 29/08* (2006.01)

(56) References Cited

U.S. PATENT DOCUMENTS

| | | | |
|---|---|---|---|
| 9,324,850 B2 | 4/2016 | Kang et al. | |
| 9,825,032 B1 | 11/2017 | Bentley et al. | |
| 10,170,484 B1 | 1/2019 | Sung et al. | |
| 10,374,099 B2* | 8/2019 | Lee | G11C 11/419 |
| 2014/0319614 A1 | 10/2014 | Paul et al. | |
| 2016/0240541 A1* | 8/2016 | Liaw | G06F 30/398 |
| 2019/0355730 A1* | 11/2019 | Mann | H10B 10/12 |
| 2020/0287020 A1 | 9/2020 | Seo et al. | |

OTHER PUBLICATIONS

Non-Final Office Action on U.S. Appl. No. 17/222,740 Dtd May 17, 2022.

Notice of Allowance on KR Appl. Ser. No. 10-2020-0075699 dated Jan. 27, 2022 (3 pages).

Notice of Allowance on U.S. Appl. No. 17/222,740 Dtd Sep. 20, 2022.

Notice of Allowance on U.S. Appl. No. 16/786,510 dated Dec. 11, 2020 (9 pages).

Taiwan Office Action on TW Patent Application No. 2020-0075699 dated May 27, 2021 (7 pages).

* cited by examiner

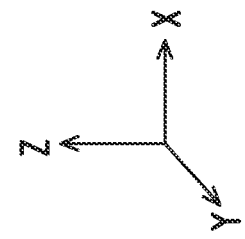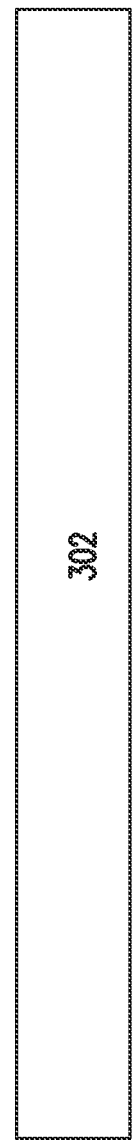
FIG. 5A

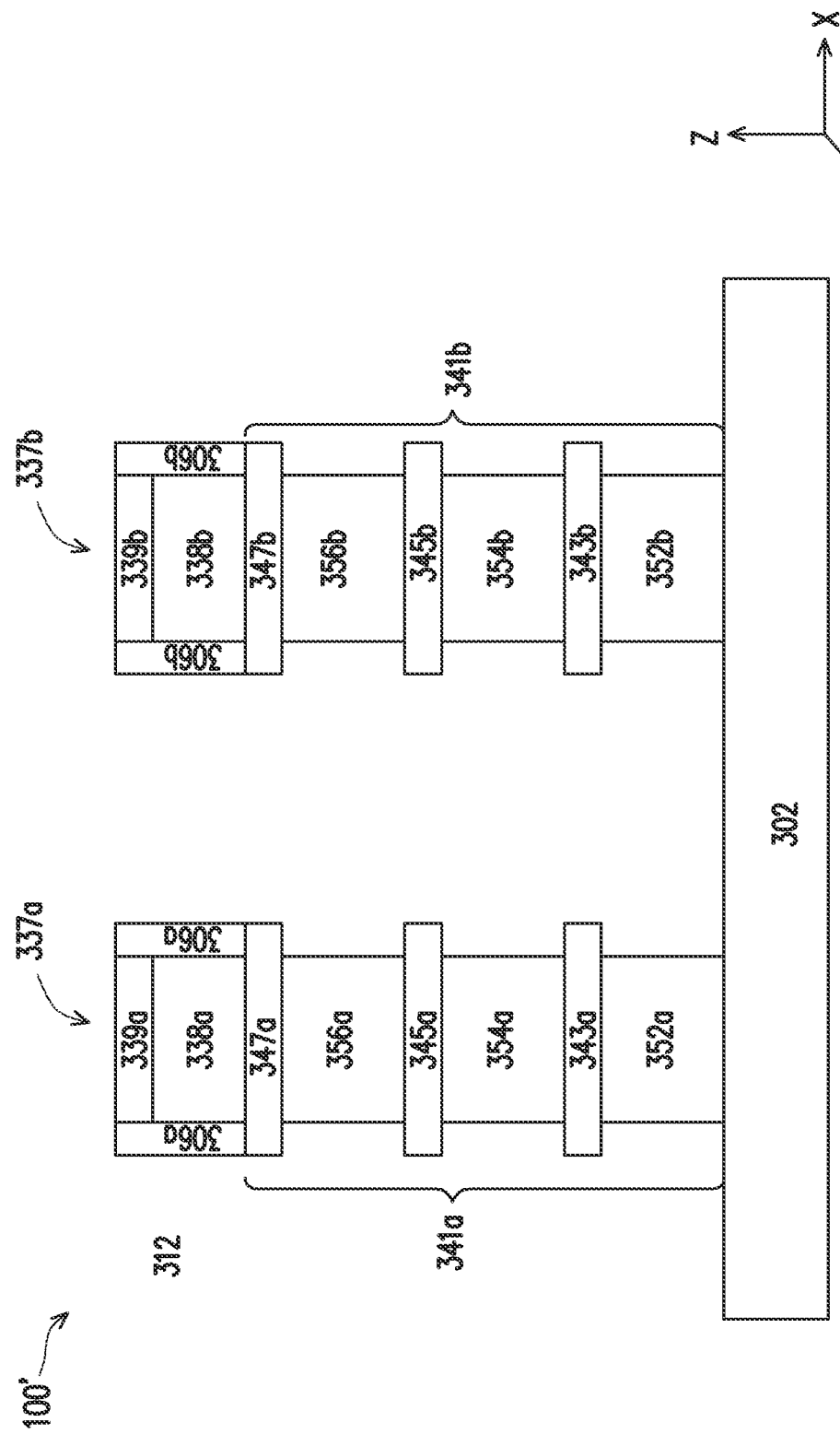

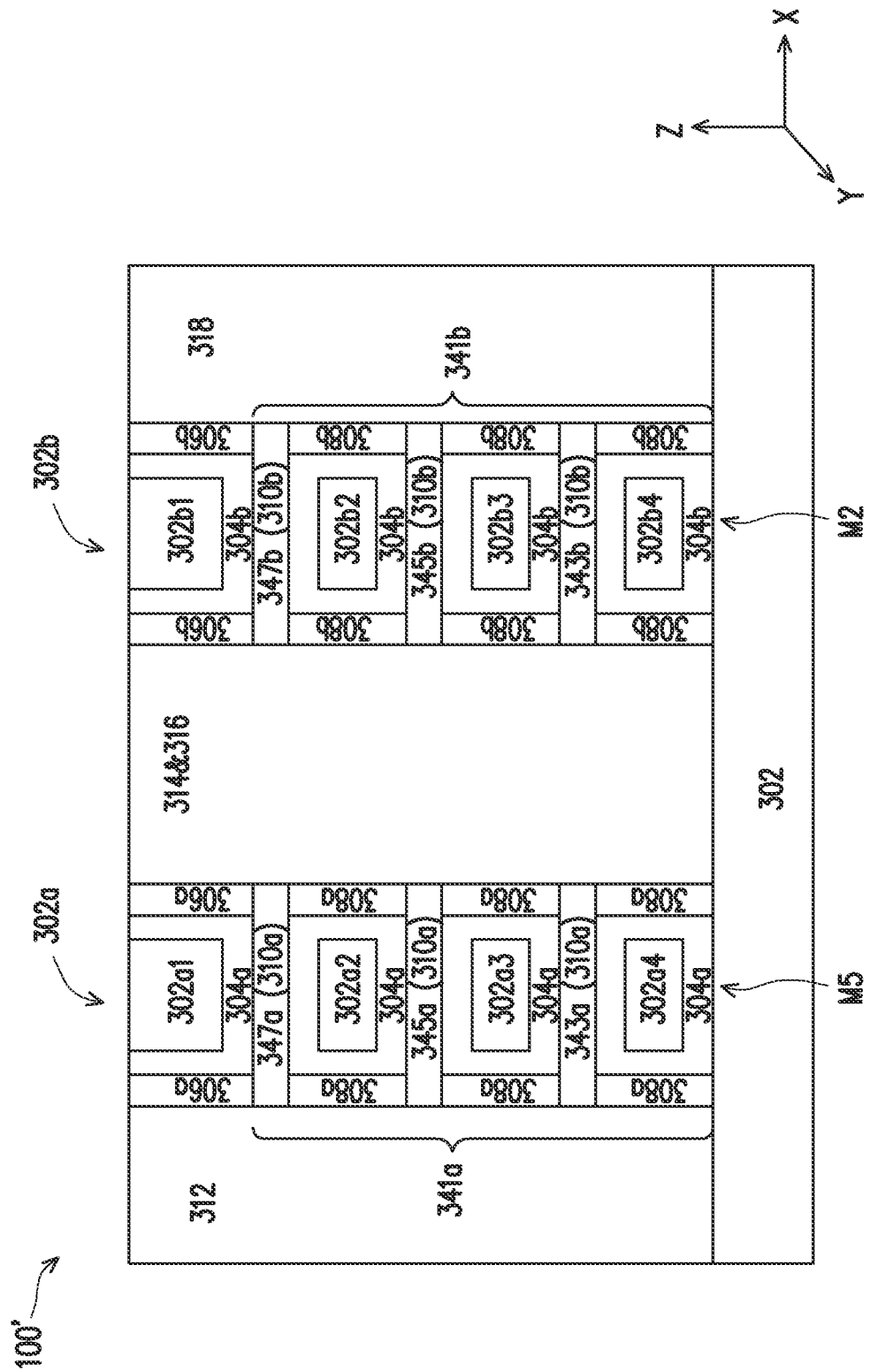

MEMORY DEVICES AND METHODS OF MANUFACTURING THEREOF

CROSS-REFERENCE TO RELATED APPLICATION

The present application is a Continuation of U.S. application Ser. No. 17/222,740, filed Apr. 5, 2021, which is a Continuation of U.S. application Ser. No. 16/786,510, filed Feb. 10, 2020, the entire contents of both of which are incorporated herein by reference.

BACKGROUND

Static random access memory (SRAM) device is a type of volatile semiconductor memory that stores data bits using bistable circuitry that does not need refreshing. An SRAM device typically includes one or more memory arrays, wherein each array includes a plurality of SRAM cells. An SRAM cell is typically referred to as a bit cell because it stores one bit of information, represented by the logic state of two cross coupled inverters. Each memory array includes multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters, which otherwise float. A word line may be coupled to plural bit cells along a row of a memory array, with different word lines provided for different rows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A, 5B, 5C, 5D, 5E, 5F, 5G, 5H, 5I, 5J, 5K, 5L, 5M, and 5N illustrate cross-sectional views of a portion of the memory cell of FIG. 1, at various fabrication stages, in accordance with some embodiments.

DETAILED DESCRIPTION

Figure 1:
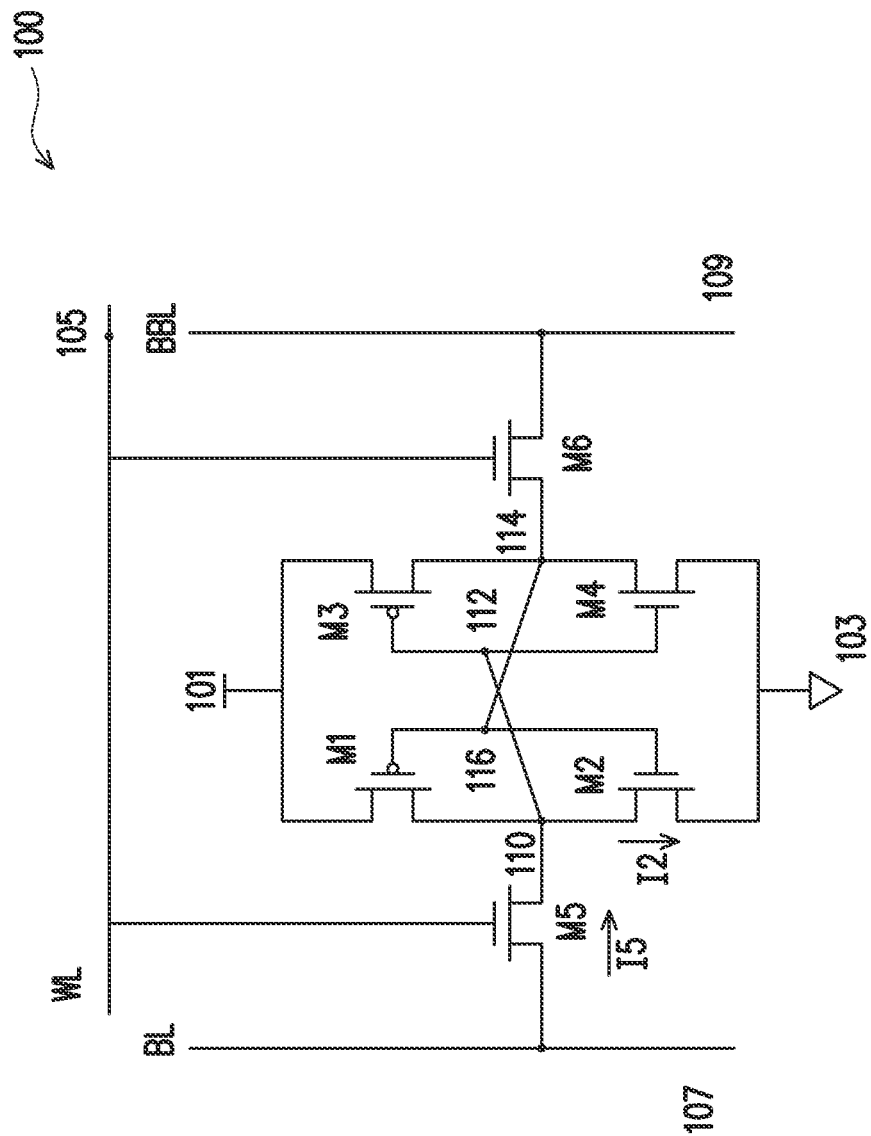
FIG. 1 illustrates an example circuit diagram of a memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, when a bit cell (e.g., an SRAM bit cell) is accessed (e.g., during a read operation), a word line pulse signal is provided to assert the bit cell's corresponding word line. Upon the corresponding word line being asserted, at least one transistor of the bit cell can be turned on such that a read operation can be performed on the bit cell. Such a transistor is typically referred to as an "access transistor." Based on the logical state stored by an output node of the bit cell, at least one transistor, serially coupled to the access transistor, can provide a discharge path. Such a transistor is typically referred to as a "pull-down transistor." The discharge path can be used to pull the voltage presented on a bit line, corresponding to the output node, through the access transistor and the pull-down transistor to ground. As such, the logical state can be read out based on whether the voltage on the bit line has been pulled down. The access transistor and pull-down transistors are typically formed in the same size partially due to some design/fabrication constraints, which causes the access transistor and pull-down transistor to conduct the same level of currents. Such substantially equal current levels in the access transistor and pull-down transistor can cause some read failure.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as fin-based transistors, can provide increased device density and increased performance over planar transistors. Some advanced non-planar transistor device architectures, such as nanostructure transistors, can further increase the performance over fin-based transistors. Example nanostructure transistors include nanosheet transistors, nanowire transistors, and the like. The nanostructure transistor includes one or more nanostructures, collectively configured as a conduction channel of the transistor, that are fully wrapped by a gate stack. When compared to the fin-based transistors where the channel is partially wrapped by a gate stack, the nanostructure transistor, in general, includes one or more gate stacks that wrap around the full perimeter of a nanostructure channel. As such, control over the nanostructure channel may be further improved, thus causing, for example, a relatively large driving current given the similar size of the fin-based transistor and nanostructure transistor.

The present disclosure provides various embodiments of a memory device in a nanostructure transistor configuration. The memory device includes a number of memory cells, each of which may include one or more access transistors and one or more pull-down transistors. To resolve the above-identified technical issues without compromising the design constraints, the access transistor of the disclosed memory device may have relatively shallow metal interconnections extending into the respective source and drain regions, and the pull-down transistor of the disclosed memory device may have at least one relatively deep metal interconnection extending into the respective source or drain region. In this way, nanostructure(s) of the access transistor, which function as the corresponding conduction channel, may be applied with relatively low stress, and nanostructure(s) of the pull-down transistor, which function as the corresponding conduction channel, may be applied with relatively high stress. The pull-down transistor can benefit from the relatively high stress (e.g., higher Ion, less parasitic capacitances, less RC delay, etc.), in accordance with some embodiments. As such, although the access transistor and the pull-down transistor are characterized with similar dimensions (e.g., channel lengths, channel widths), the pull-down transistor can conduct a relatively large current, when compared to the current conducting in the access transistor.

Referring to FIG. 1, an example circuit diagram of a memory cell (a memory bit, or a bit cell) 100 is illustrated. In accordance with some embodiments of the present disclosure, the memory cell 100 in configured as a static random access memory (SRAM) cell that includes a number of transistors. For example in FIG. 1, the memory cell 100 includes a six-transistor (6T)-SRAM cell. Each of the transistors may be formed in a nanostructure transistor configuration, which shall be discussed in further detail below. In some other embodiments, the memory cell 100 may be implemented as any of a variety of SRAM cells such as, for example, a two-transistor-two-resistor (2T-2R) SRAM cell, a four-transistor (4T)-SRAM cell, an eight-transistor (8T)-SRAM cell, a ten-transistor (10T)-SRAM cell, etc. Although the discussion of the current disclosure is directed to a 6T-SRAM cell, it is understood that other embodiments of the current disclosure can also be used in any of the memory cells such as, for example, dynamic random access (DRAM) memory cells.

As shown in FIG. 1, the memory cell 100 includes 6 transistors: M1, M2, M3, M4, M5, and M6. The transistors M1 and M2 are formed as a first inverter and the transistors M3 and M4 are formed as a second inverter, wherein the first and second inverters are cross-coupled to each other. Specifically, the first and second inverters are each coupled between first voltage reference 101 and second voltage reference 103. In some embodiments, the first voltage reference 101 is a voltage level of a supply voltage applied to the memory cell 100, which is typically referred to as "Vdd." The second voltage reference 103 is typically referred to as "ground." The first inverter (formed by the transistors M1 and M2) is coupled to the transistor M5, and the second inverter (formed by the transistors M3 and M4) is coupled to the transistor M6. In addition to being coupled to the first and second inverters, the transistors M5 and M6 are each coupled to a word line (WL) 105 and are coupled to a bit line (BL) 107 and a bit bar line 109 (BBL), respectively.

In some embodiments, the transistors M1 and M3 are referred to as pull-up transistors of the memory cell 100 (hereinafter "pull-up transistor M1" and "pull-up transistor M3," respectively); the transistors M2 and M4 are referred to as pull-down transistors of the memory cell 101 (hereinafter "pull-down transistor M2" and "pull-down transistor M4," respectively); and the transistors M5 and M6 are referred to as access transistors of the memory cell 100 (hereinafter "access transistor M5" and "access transistor M6," respectively). In some embodiments, the transistors M2, M4, M5, and M6 each includes an n-type metal-oxide-semiconductor (NMOS) transistor, and M1 and M3 each includes a p-type metal-oxide-semiconductor (PMOS) transistor. Although the illustrated embodiment of FIG. 1 shows that the transistors M1-M6 are either NMOS or PMOS transistors, any of a variety of transistors or devices that are suitable for use in a memory device may be implemented as at least one of the transistors M1-M6 such as, for example, a bipolar junction transistor (BJT), a high-electron-mobility transistor (HEMT), etc.

The access transistors M5 and M6 each has a gate coupled to the WL 105. The gates of the transistors M5 and M6 are configured to receive a pulse signal, through the WL 105, to allow or block an access of the memory cell 100 accordingly, which will be discussed in further detail below. The transistors M2 and M5 are coupled to each other at node 110 with the transistor M2's drain and the transistor M5's source. The node 110 is further coupled to a drain of the transistor M1 and node 112. The transistors M4 and M6 are coupled to each other at node 114 with the transistor M4's drain and the transistor M6's source. The node 114 is further coupled to a drain of the transistor M3 and node 116.

When a memory cell (e.g., the memory cell 100) stores a data bit, a first node of the bit cell is configured to be at a first logical state (either a logical 1 or a logical 0), and a second node of the bit cell is configured to be at a second logical state (either a logical 0 or a logical 1). The first and second logical states are complementary with each other. In some embodiments, the first logical state at the first node may represent the logical state of the data bit stored in the memory cell. For example, in the illustrated embodiment of FIG. 1, when the memory cell 100 store a data bit at a logical 1 state, the node 110 is configured to be at the logical 1 state, and the node 114 is configured to be at the logical 0 state.

To read the logical state of the data bit stored in the memory cell 100, the BL 107 and BBL 109 are pre-charged to Vdd (e.g., a logical high). Then the WL 105 is asserted, or activated, by an assert signal to a logical high, which turns on the access transistors M5 and M6. Specifically, a rising edge of the assert signal is received at the gates of the access transistors M5 and M6, respectively, so as to turn on the access transistors M5 and M6. Once the access transistors M5 and M6 are turned on, based on the logical state of the data bit, the pre-charged BL 107 or BBL 109 may start to be discharged. For example, when the memory cell 100 stores a logical 0, the node 110 may present a voltage corresponding to the logical 0, and the node 114 may present a voltage corresponding to the complementary logical 1. In response to the access transistors M5 and M6 being turned on, a discharge path, starting from the pre-charged BL 107, through the access transistor M5 and pull-down transistor M2, and to ground 103, may be provided. Along the discharge path, the access transistor M5 and the pull-down transistor M6 may conduct current 15 and current 12, respectively. While the voltage level on the BL 107 is pulled down by such a discharge path, the pull-down transistor M4 may remain turned off. As such, the BL 107 and the BBL 109 may respectively present a voltage level to produce a large enough voltage difference between the BL 107 and BBL 109. Accordingly, a sensing amplifier, coupled to the BL 107 and BBL 109, can use a polarity of the voltage difference to determine whether the logical state of the data bit is a logical 1 or a logical 0.

In general, to efficiently read the logical state (e.g., without read failure), the pull-down transistor M2 is preferably to be larger than the access transistor M5 (so as to provide larger current). However, partially due to the design constraint, the access transistor M5 and pull-down transistor M2 are frequently made to have the same dimensions (e.g., the same channel width, the same channel length), which may more likely result in read failure. The same issues also occur to the access transistor M6 and pull-down transistor M4.

In this regard, each of the transistors M1-M6 is configured as a nanostructure transistor, in accordance with various embodiments of the present disclosure. Further, each of the pull-down transistors M2 and M4 is configured to include at least one of its drain/source regions to have a relatively deep recess, while each of the access transistors M5 and M6 is configured to include at least one of its drain/source regions to have a relatively shallow recess. The deep recess may be filled with a metal structure with a deeper depth, and the shallow recess may be filled with a metal structure with a shallower depth. The metal structure having such a deep depth can provide tensile stress on respective nanostructures of the conduction channel of each of the pull-down transistor M2 and M4, which can advantageously increase the respective conduction current (Ion). In some embodiments, the metal structure can apply compressive stress on the nanostructures by pressing the nanostructures along a substantially vertical direction (e.g., the direction along which the metal structure extends), and tensile stress on the nanostructures by stretching the nanostructures along a substantially horizontal direction (e.g., the direction along which the conduction channel extends). Thus, rather than compromising the design constraints, each of the pull-down transistors M2 and M4 can be made (e.g., by filling the respective source and/or drain region with a metal structure having a greater depth) to conduct greater Ion. As such, the above-identified technical issues can be resolved.

Figure 2A:
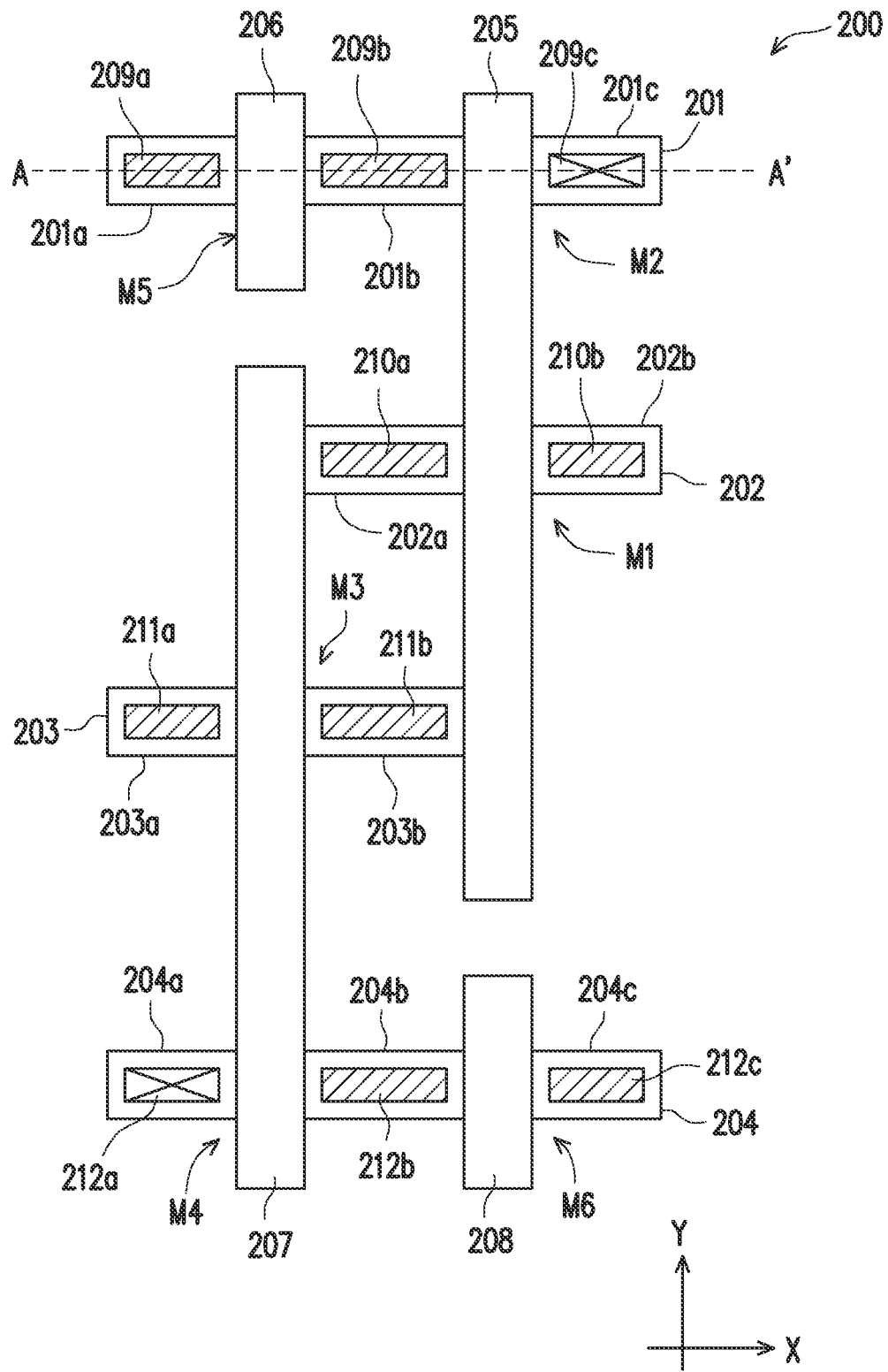
FIGS. 2A, 2B, and 2C each illustrates an example design layout of the memory cell of FIG. 1, in accordance with some embodiments.
Figure 2B:
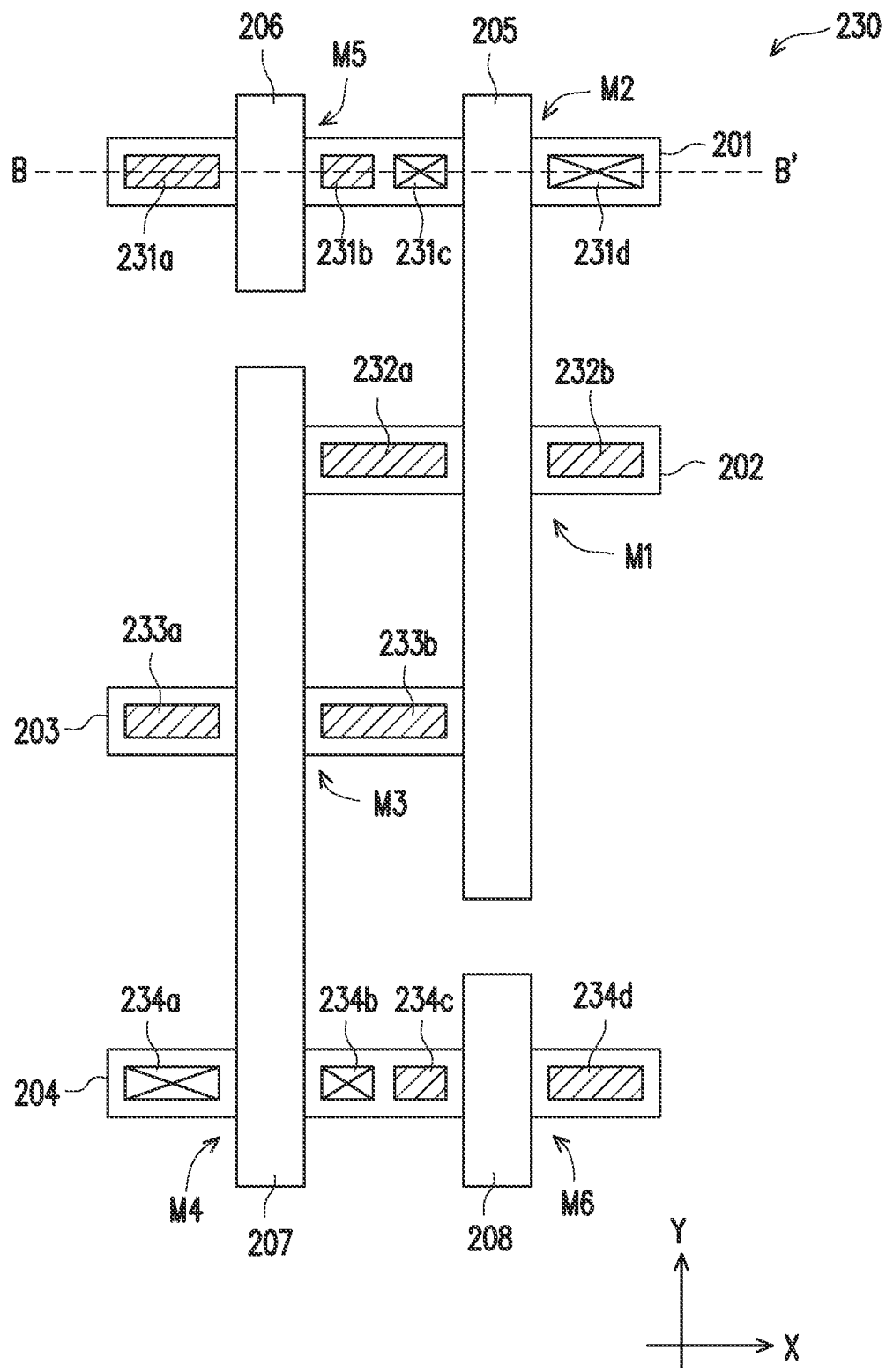
Figure 2C:
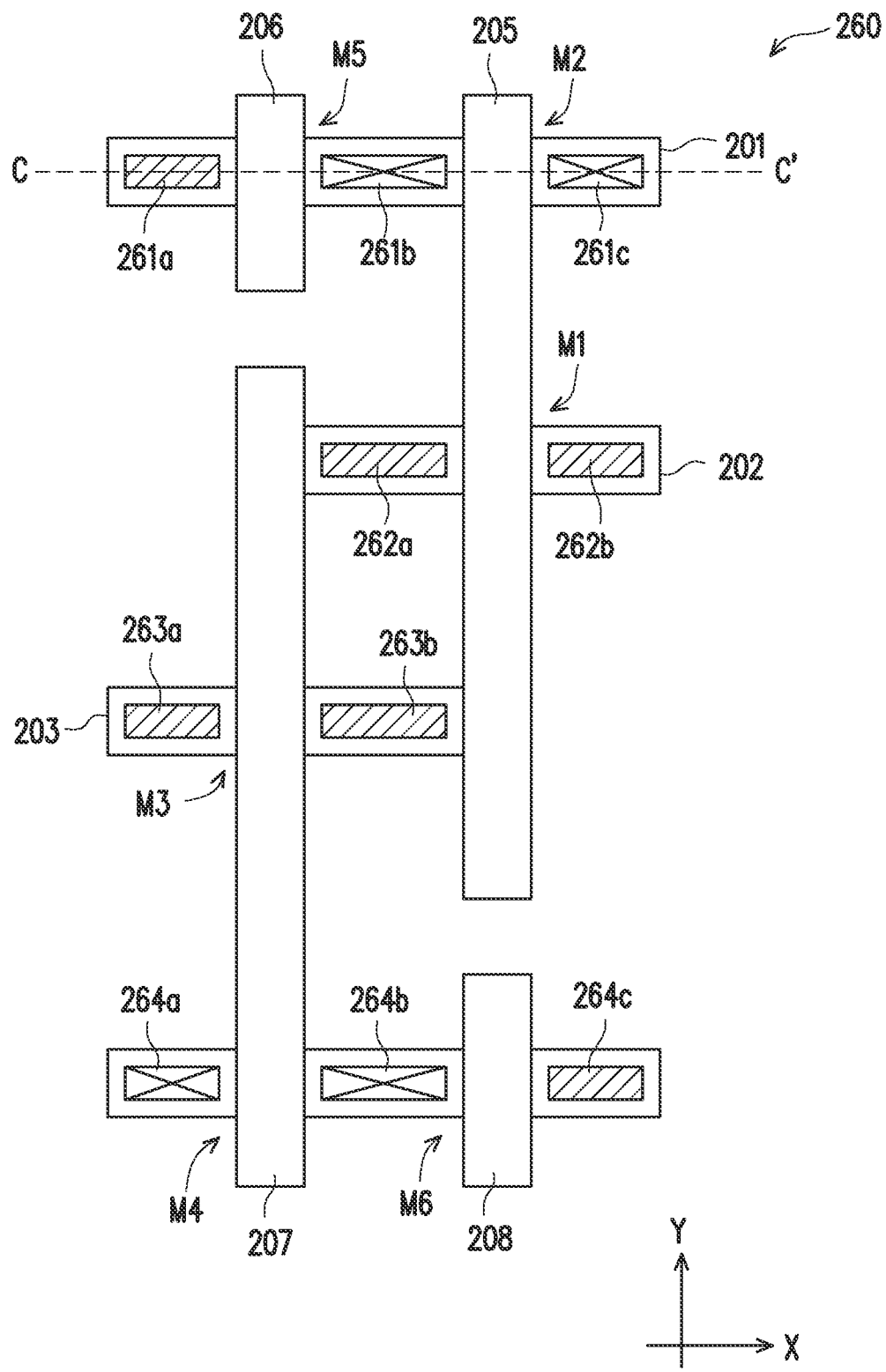
Figure 3A:
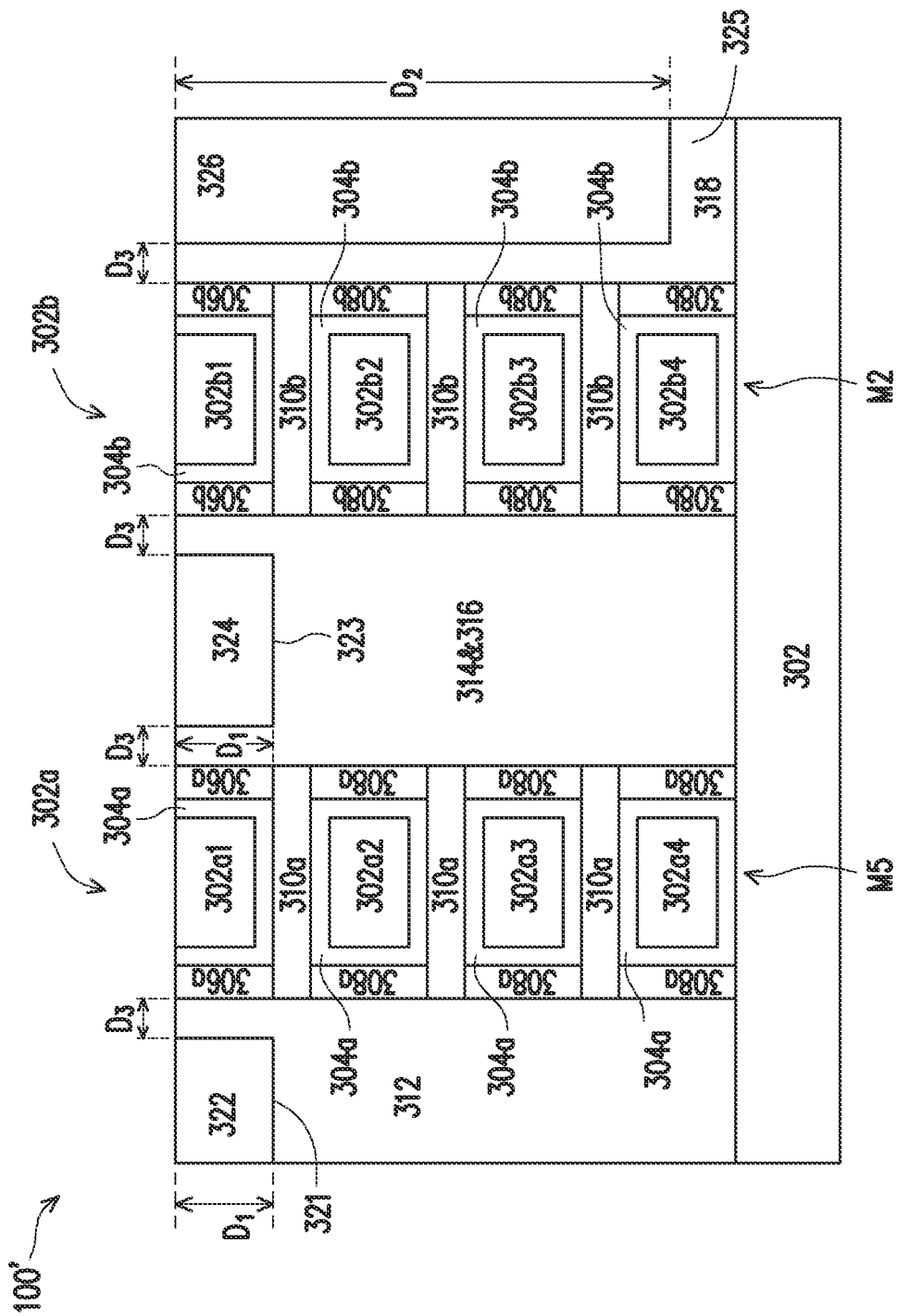
FIGS. 3A, 3B, and 3C each illustrates a cross-sectional view of a portion of the memory cell formed by the corresponding layout of FIGS. 2A-2C, in accordance with some embodiments.
Figure 3B:
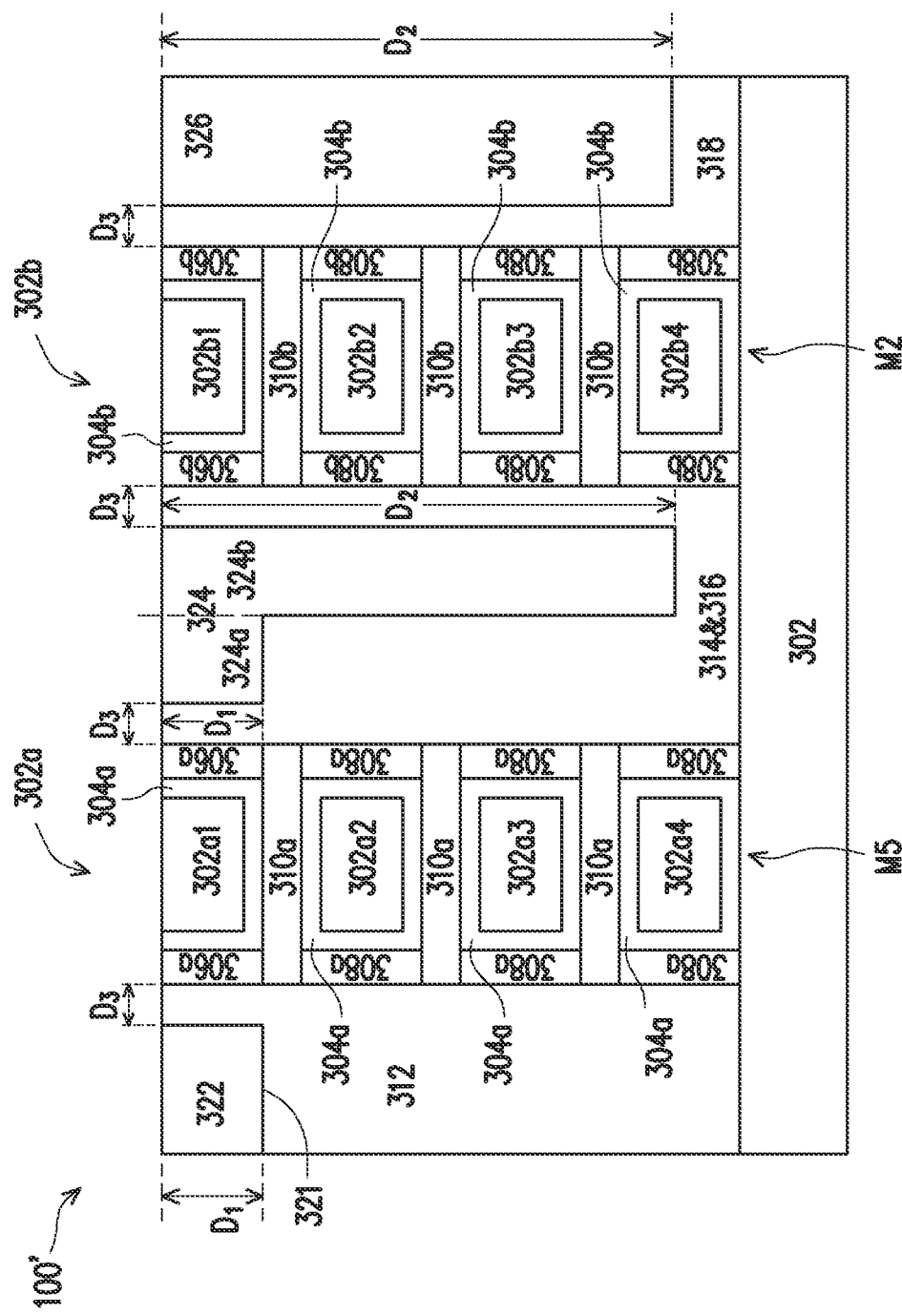
Figure 3C:
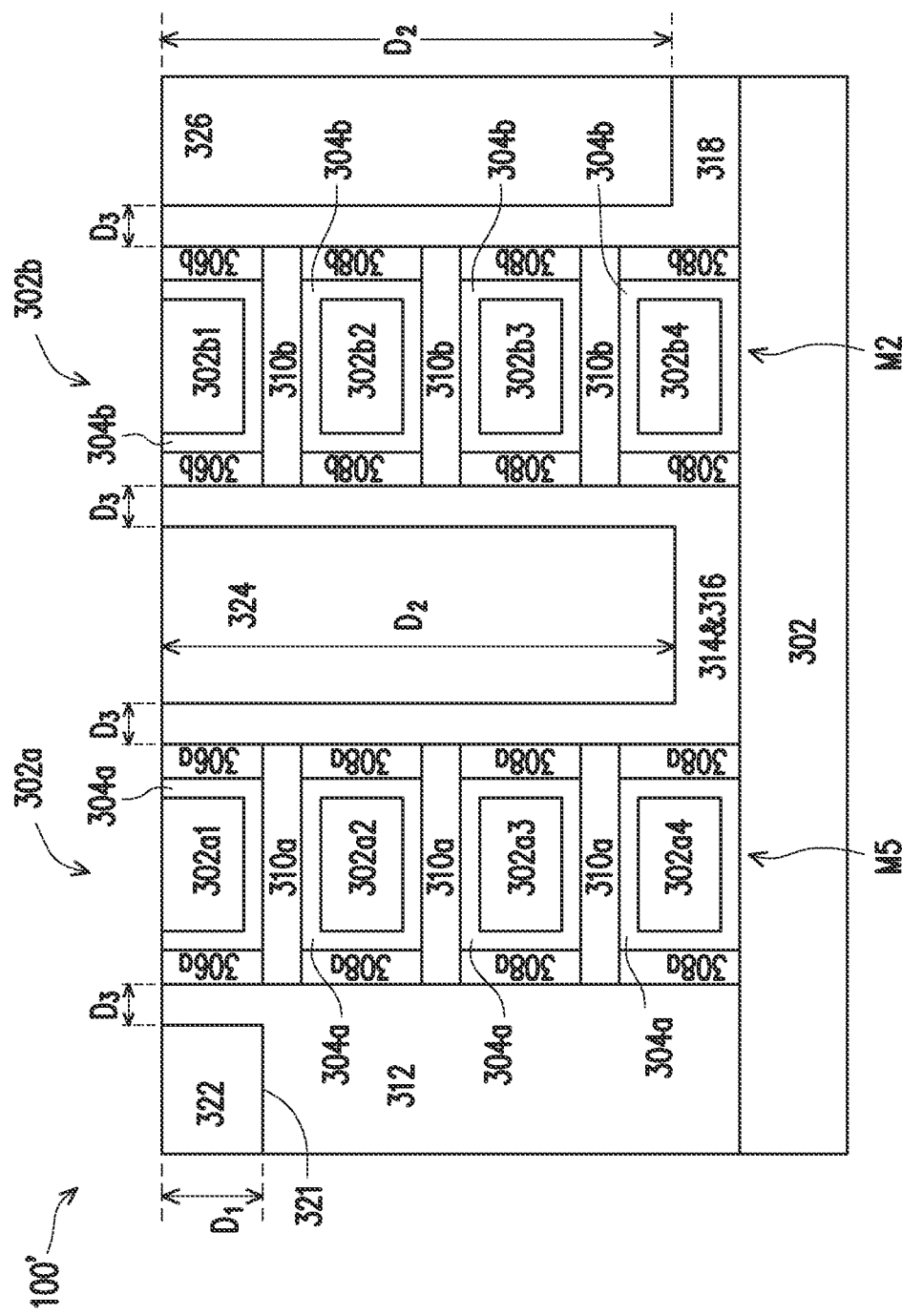

FIGS. 2A, 2B, and 2C illustrate various examples of circuit layouts to make the memory cell 100 in such a configuration (e.g., with the access transistors characterized with relatively shallow drain/source metal structures, and the pull-down transistors characterized with relatively deep drain/source metal structures). FIGS. 3A, 3B, and 3C illustrate cross-sectional views of a portion of the memory cell 100, corresponding to the layouts of FIGS. 2A, 2B, and 2C, respectively. For example, FIG. 3A provides the cross-sectional view of the portion of the memory cell 100 cut along line A-A' of FIG. 2A (e.g., the portion that includes the pull-down transistor M2 and access transistor M5); FIG. 3B provides the cross-sectional view of the portion of the memory cell 100 cut along line B-B' of FIG. 2B (e.g., the portion that includes the pull-down transistor M2 and access transistor M5); and FIG. 3C provides the cross-sectional view of the portion of the memory cell 100 cut along line C-C' of FIG. 2C (e.g., the portion that includes the pull-down transistor M2 and access transistor M5). The layouts shown in FIGS. 2A-C may be used to fabricate nanostructure transistors, in some embodiments. However, it is understood that the layouts of FIGS. 2A-C are not limited to fabricating nanostructure transistors. Each of the layouts of FIGS. 2A-C may be used to fabricate any of various other types of transistors such as, for example, fin-based transistors (typically knows as FinFETs), nanowire transistors, while remaining within the scope of the present disclosure. The components of the layouts shown in FIGS. 2A-C are the same or are similar to those depicted in FIG. 1 with the same reference number, and the detailed description thereof is omitted. It is appreciated that for clarity purposes, each of the layouts in FIGS. 2A-2C has been simplified. Thus, some of the components (e.g., BL 107, BBL 109, WL 105) shown in FIG. 1 are omitted in the layouts of FIGS. 2A-C.

Referring first to FIG. 2A, an example circuit layout 200 is depicted, in accordance with various embodiments. As shown, the circuit layout 200 includes a number of features 201, 202, 203, and 204 extending along a first direction (e.g., the X direction), and a number of features 205, 206, 207, and 208 extending along a second direction perpendicular to the first direction (e.g., the Y direction). Each of the features 200-2108 may correspond to one or more patterning process (e.g., a photolithography process) to make a physical device feature.

For example, the features 201-204 may be used to define or otherwise make an active region on a substrate. Such an active region may be a stack of alternating layers of one or more nanostructure transistors, a fin-shaped region of one or more FinFETs, or a doped well region of one or more planar transistors. The active region may serve as a source region or drain region of the respective transistor. Accordingly, the features 201-204 may be herein referred to as "active features 201, 202, 203, and 204," respectively. In some embodiments, the active features 201 and 204 may each correspond to an n-type region, and the active features 202 and 203 may each correspond to a p-type region.

The features 205-208 may be used to define or otherwise make gates of the respective transistors. Accordingly, the features 205-208 may be herein referred to as "gate features 205, 206, 207, and 208," respectively. Each of the gate features 205-208 can extend across a corresponding one of the active features 201-204 to define a respective one of the transistors M1-M6.

For example, the gate feature 206 is used to define a gate region of the access transistor M5, section 201a and 201b of the active feature 201 are used to define respective drain region and source region of the access transistor M5, and a portion of the active feature 201 overlapped by the gate feature 206 is used to define nanostructures (e.g., a conduction channel) of the access transistor M5. The gate feature 205 is used to define a gate region of the pull-down transistor M2, section 201b and 201c of the active feature 201 are used to define respective drain region and source region of the pull-down transistor M2, and a portion of the active feature 201 overlapped by the gate feature 205 is used to define nanostructures (e.g., a conduction channel) of the pull-down transistor M2. The gate feature 205 is also used to define a gate region of the pull-up transistor M1, section 202a and 202b of the active feature 202 are used to define respective source region and drain region of the pull-up transistor M1, and a portion of the active feature 202 overlapped by the gate feature 205 is used to define nanostructures (e.g., a conduction channel) of the pull-up transistor M1. The gate feature 207 is used to define a gate region of the pull-up transistor M3, section 203a and 203b of the active feature 203 are used to define respective drain region and source region of the pull-up transistor M3, and a portion of the active feature 203 overlapped by the gate feature 207 is used to define nanostructures (e.g., a conduction channel) of the pull-up transistor M3. The gate feature 207 is also used to define a gate region of the pull-down transistor M4, section 204a and 204b of the active feature 204 are used to define respective source region and drain region of the pull-down transistor M4, and a portion of the active feature 204 overlapped by the gate feature 207 is used to define nanostructures (e.g., a conduction channel) of the pull-down transistor M4. The gate feature 208 is used to define a gate region of the access transistor M6, section 204b and 204c of the active feature 204 are used to define respective source region and drain region of the access transistor M6, and a portion of the active feature 204 overlapped by the gate feature 208 is used to define nanostructures (e.g., a conduction channel) of the access transistor M6.

In some embodiments, each of the transistors M1-M6, formed by the layout 200 (and the layouts 230 and 260, which shall be discussed below), is referred to have a fin number of one, based on the number of active feature(s) overlaid by the respective gate feature of each of the transistors. It is appreciated that each of the transistors M1-M6 can have any fin number while remaining within the scope of the present disclosure.

Additionally, the layout 200 includes a number of features 209a, 209b, 209c, 210a, 210b, 211a, 211b, 212a, 212b, and 212c extending along the X direction. Each of the features 209a-c, 210a-b, 211a-b, and 212a-c may overlay the corresponding section of an active feature. In some embodiments, each of the features 209a-c, 210a-b, 211a-b, and 212a-c may be used to define or otherwise make the contact, metal structure, or interconnection for a respective one of the transistors M1-M6. Accordingly, the features 209a-c, 210a-b, 211a-b, and 212a-c may be herein referred to as "contact features 209a-c, 210a-b, 211a-b, and 212a-c," respectively. In some embodiments, such a metal structure can be formed as a via extending into the source/drain region of a respective one of the transistors M1-M6. The metal structures (which shall be shown below with respect to FIG. 3A) may be formed subsequently to the formation of source/drain regions of the transistors M1-M6. Accordingly, the metal structures may sometimes be referred to as part of a middle-end-of-line (MEOL) layer or a back-end-of-line (BEOL) layer.

For example, the contact features 209a and 209b may be used to form metal structures extending into the drain region and source region of the access transistor M5, respectively. The contact features 209b and 209c may be used to form metal structures extending into the drain region and source region of the pull-down transistor M2, respectively. The contact features 210a and 210b may be used to form metal structures extending into the source region and drain region of the pull-up transistor M1, respectively. The contact features 211a and 211b may be used to form metal structures extending into the drain region and source region of the pull-up transistor M3, respectively. The contact features 212a and 212b may be used to form metal structures extending into the source region and drain region of the pull-down transistor M4, respectively. The contact features 212b and 212c may be used to form metal structures extending into the source region and drain region of the access transistor M6, respectively. It is appreciated that the contact feature 209b may be used to form a continuous metal structure shared (e.g., connected) by the access transistor M5's source and the pull-down transistor M2's drain, and the contact feature 212b may be used to form a continuous metal structure shared (e.g., connected) by the pull-down transistor M4's drain and the access transistor M6's source.

In accordance with some embodiments of the present disclosure, the metal structures formed by the contact features 209a-b, 210a-b, 211a-b, and 212b-c may extend into respective source/drain regions by a first depth, and the metal structures formed by the contact features 209c and 212a may extend into respective source/drain regions by a second, different depth. The second, different depth is substantially greater than the first depth. As such, the metal structures formed by the contact features 209c and 212a may cause more strain to be induced in corresponding nanostructures, when compared to the metal structures formed by the contact features 209a-b, 210a-b, 211a-b, and 212b-c, which shall be discussed in detail below.

Referring to FIGS. 2B and 2C, two other example layouts, 230 and 260, to form the memory cell 100 (FIG. 1) are depicted. Each of the layouts 230 and 260 is substantially similar to the layout 200 except that the numbers of contact features to form relatively deep metal structures are different. Thus, some components of the layouts 230 and 260 (e.g., the active features 201-204, and gate features 205-208) shall be referred to the same reference numbers, and the detailed description thereof are not repeated.

As shown in FIG. 2B, the layout 230 includes a number of features 231a, 231b, 231c, 231d, 232a, 232b, 233a, 233b, 234a, 234b, 234c, and 234d extending along the X direction. Each of the features 231a-d, 232a-b, 233a-b, and 234a-d may overlay the corresponding section of an active feature. In some embodiments, each of the features 231a-d, 232a-b, 233a-b, and 234a-d may be used to define or otherwise make the contact, metal structure, or interconnection for a respective one of the transistors M1-M6. Accordingly, the features 231a-d, 232a-b, 233a-b, and 234a-d may be herein referred to as "contact features 231a-d, 232a-b, 233a-b, and 234a-d," respectively. In some embodiments, such a metal structure can be formed as a via extending into the source/drain region of a respective one of the transistors M1-M6. The metal structures (which shall be shown below with respect to FIG. 3B) may be formed subsequently to the formation of source/drain regions of the transistors M1-M6. Accordingly, the metal structures may sometimes be referred to as part of a middle-end-of-line (MEOL) layer or a back-end-of-line (BEOL) layer.

For example, the contact features 231a and 231b may be used to form metal structures extending into the drain region and source region of the access transistor M5, respectively. The contact features 231c and 231d may be used to form metal structures extending into the drain region and source region of the pull-down transistor M2, respectively. The contact features 232a and 232b may be used to form metal structures extending into the source region and drain region of the pull-up transistor M1, respectively. The contact features 233a and 233b may be used to form metal structures extending into the drain region and source region of the pull-up transistor M3, respectively. The contact features 234a and 234b may be used to form metal structures extending into the source region and drain region of the pull-down transistor M4, respectively. The contact features 234c and 234d may be used to form metal structures extending into the source region and drain region of the access transistor M6, respectively. Although the contact feature 231b and 231c are illustrated as discrete components (to form discrete metal structures) in FIG. 2B, it is appreciated that the contact features 231b and 231c may be used to form a continuous metal structure shared (e.g., connected) by the access transistor M5's source and the pull-down transistor M2's drain. Similarly, the contact features 234b and 234c may be used to form a continuous metal structure shared (e.g., connected) by the pull-down transistor M4's drain and the access transistor M6's source.

In accordance with some embodiments of the present disclosure, the metal structures formed by the contact features 231a-b, 232a-b, 233a-b, and 234c-d may extend into respective source/drain regions by a first depth, and the metal structures formed by the contact features 231c-d and 234a-b may extend into respective source/drain regions by a second, different depth. The second, different depth is substantially greater than the first depth. As such, the metal structures formed by the contact features 231c-d and 234a-b may cause more strain to be induced in corresponding nanostructures, when compared to the metal structures formed by the contact features 231a-b, 232a-b, 233a-b, and 234c-d, which shall be discussed in detail below.

As shown in FIG. 2C, the layout 260 includes a number of features 261a, 261b, 261c, 262a, 262b, 263a, 263b, 264a, 264b, and 264c extending along the X direction. Each of the features 261a-c, 262a-b, 263a-b, and 264a-c may overlay the corresponding section of an active feature. In some embodiments, each of the features 261a-c, 262a-b, 263a-b, and 264a-c may be used to define or otherwise make the contact, metal structure, or interconnection for a respective one of the transistors M1-M6. Accordingly, the features 261a-c, 262a-b, 263a-b, and 264a-c may be herein referred to as "contact features 261a-c, 262a-b, 263a-b, and 264a-c," respectively.

In some embodiments, such a metal structure can be formed as a via extending into the source/drain region of a respective one of the transistors M1-M6. The metal structures (which shall be shown below with respect to FIG. 3C) may be formed subsequently to the formation of source/drain regions of the transistors M1-M6. Accordingly, the metal structures may sometimes be referred to as part of a middle-end-of-line (MEOL) layer or a back-end-of-line (BEOL) layer.

For example, the contact features 261a and 261b may be used to form metal structures extending into the drain region and source region of the access transistor M5, respectively. The contact features 261b and 261c may be used to form metal structures extending into the drain region and source region of the pull-down transistor M2, respectively. The contact features 262a and 262b may be used to form metal structures extending into the source region and drain region of the pull-up transistor M1, respectively. The contact features 263a and 264b may be used to form metal structures extending into the drain region and source region of the pull-up transistor M3, respectively. The contact features 264a and 264b may be used to form metal structures extending into the source region and drain region of the pull-down transistor M4, respectively. The contact features 264b and 264c may be used to form metal structures extending into the source region and drain region of the access transistor M6, respectively. It is appreciated that the contact feature 261b may be used to form a continuous metal structure shared (e.g., connected) by the access transistor M5's source and the pull-down transistor M2's drain, and the contact feature 264b may be used to form a continuous metal structure shared (e.g., connected) by the pull-down transistor M4's drain and the access transistor M6's source.

In accordance with some embodiments of the present disclosure, the metal structures formed by the contact features 209a-b, 210a-b, 211a-b, and 212b-c may extend into respective source/drain regions by a first depth, and the metal structures formed by the contact features 209c and 212a may extend into respective source/drain regions by a second, different depth. The second, different depth is substantially greater than the first depth. As such, the metal structures formed by the contact features 209c and 212a may cause more strain to be induced in corresponding nanostructures, when compared to the metal structures formed by the contact features 209a-b, 210a-b, 211a-b, and 212b-c, which shall be discussed in detail below.

Referring to FIG. 3A, a cross-sectional view of a portion of the memory cell 100 that includes the access transistor M5 and pull-down transistor M2 (hereinafter "partial cell 100'") is depicted, in accordance with various embodiments. The partial cell 100', as shown in the illustrated embodiment of FIG. 3A, may be formed based on the layout 200 of FIG. 2A. For example, the partial cell 100' corresponds to a portion of the layout 200, cut along line A-A', (e.g., 201a, 206, 201b, 205, and 201c), which shall be discussed in further detail bellow. Although not shown, it is appreciated that other portions of the memory cell 100 (e.g., the access transistor M6 and pull-down transistor M4) share a structure substantially similar to the cross-sectional view of FIG. 3A.

As shown, the access transistor M5 and pull-down transistor M2 are formed on a substrate 302. The access transistor M5 includes a gate metal 302a, a gate dielectric 304a, a pair of offset gate spacers 306a, a number of inner spacers 308a, a number of nanostructures 310a, a drain region 312, and a source region 314. The pull-down transistor M2 includes a gate metal 302b, a gate dielectric 304b, a pair of offset gate spacers 306b, a number of inner spacers 308b, a number of nanostructures 310b, a drain region 316, and a source region 318. In some embodiments, the gate metal 302a (together with the gate dielectric 304a and offset gate spacers 306a) may be formed in accordance with the gate feature 206 (FIG. 2A), the drain region 312 may be formed in accordance with the section 201a (FIG. 2A), and the source region 314 may be formed in accordance with the section 201b (FIG. 2A). Similarly, the gate metal 302b (together with the gate dielectric 304b and offset gate spacers 306b) may be formed in accordance with the gate feature 205 (FIG. 2A), the drain region 316 may be formed in accordance with the section 201b (FIG. 2A), and the source region 318 may be formed in accordance with the section 201c (FIG. 2A). In some embodiments, the source region 314 of the access transistor M5 and the drain region 316 of the pull-down transistor M2 may merge together as a continuous structure, which connects the access transistor M5 to the pull-down transistor M2 in series.

Specifically, the gate metal 302a of the access transistor M5 may include a number of gate metal sections 302a1, 302a2, 302a3, and 302a4. When viewed in perspective, the gate metal sections 302a1 and 302a2 may adjoin or merge together to wrap around one of the nanostructures 310a, with a portion of the gate dielectric 304a disposed therebetween. The gate metal sections 302a2 and 302a3 may adjoin or merge together to wrap around one of the nanostructures 310a, with a portion of the gate dielectric 304a disposed therebetween. The gate metal sections 302a3 and 302a4 may adjoin or merge together to wrap around one of the nanostructures 310a, with a portion of the gate dielectric 304a disposed therebetween. Similarly, the gate metal 302b of the pull-down transistor M2 may include a number of gate metal sections 302b1, 302b2, 302b3, and 302b4. When viewed in perspective, the gate metal sections 302b1 and 302b2 may adjoin or merge together to wrap around one of the nanostructures 310b, with a portion of the gate dielectric 304b disposed therebetween. The gate metal sections 302b2 and 302b3 may adjoin or merge together to wrap around one of the nanostructures 310b, with a portion of the gate dielectric 304b disposed therebetween. The gate metal sections 302b3 and 302b4 may adjoin or merge together to wrap around one of the nanostructures 310b, with a portion of the gate dielectric 304b disposed therebetween.

The formation of such nanostructure transistors shall be discussed below with respect to the flow chart of FIG. 4. In some embodiments, after forming the source/drain regions 312-318, the contact features 209a, 209b, and 209c (FIG. 2A) may be used to form metal structures 322, 324, and 326, respectively. The metal structures 322-326 are electrically connected to the source/drain regions 312-318, respectively. For example, a first patterning process, corresponding to the contact features 209a-b, may be performed to etch the drain region 312 and source/drain regions 314/316, thereby forming respective recesses (via holes, or trenches) 321 and 323. In the illustrated embodiment of FIG. 3A, a single recess (e.g., 323) may be formed in the merged source/drain regions 314/316. It is appreciated that two respective recesses, either merged with or spaced apart from each other, may be formed in the source region 314 and the drain region 316. The recesses 321 and 323 may have a depth, $D_1$. The "depth" of a recess may be referred to an extent by which the recess vertically extends into a structure. Thus, the depth may be measured from a top surface of the structure to a bottom surface of the recess. Prior to or subsequently to the first patterning process, a second patterning process, corresponding to the contact feature 209c, may be performed to etch the source region 318, thereby forming a recess (a via hole, or a trench) 325. The recess 325 may have a depth, $D_2$. The depth $D_2$ is substantially greater than the depth $D_1$. Each of the recesses 321, 323, and 325 may be formed to be laterally spaced apart from adjacent spacer(s) or nanostructure(s) by a distance, $D_3$, in some embodiments. As shown in FIG. 3A, such a lateral distance $D_3$ may be a nonzero value. It is appreciated that the distance $D_3$ may be a zero value (e.g., the recesses 321, 323, and 325 is in direct contact with the adjacent spacer(s) or nanostructure(s)), while remaining within the scope of the present disclosure.

In some embodiments, the metal structures 322 and 324 are formed by filling the recesses 321 and 323 with a metal material (e.g., copper, tungsten), respectively. The metal structure 326 is formed by filling the recess 325 with the same metal material. As such, the metal structures 322 and 324 may inherit the geometric dimensions of the depth of the recesses 321-323, and the metal structure 326 may inherit the geometric dimensions of the depth of the recess 325. For example, the metal structure 322 may be extended into the drain region 312 by $D_1$ and spaced apart from one of the offset gate spacer 306a by $D_3$, the metal structure 324 may be extended into the source region 314 and drain region 316 by $D_1$ and spaced apart from the other one of the offset gate spacer 306a and one of the offset gate spacers 306b by $D_3$, the metal structure 326 may be extended into the source region 318 by $D_2$ and spaced apart from the other one of the offset gate spacer 306b by $D_3$.

In accordance with various embodiments of the present disclosure, the metal structure extending farther (e.g., deeper) into the source/drain region of a nanostructure transistor can induce more stress on the nanostructure transistor's nanostructures (which collectively constitute a conduction channel of the nanostructure transistor), when compared to the metal structure extending less farther (e.g., shallower) into the source/drain region of the nanostructure transistor. For example, the metal structure 326, extending into the source region 318 by depth $D_2$, may apply or induce more compressive and/or tensile stress on at least one of the nanostructures 310b, while the metal structure 324, extending into the drain region 316 by depth $D_1$, may apply or induce less (or nearly no) compressive and/or tensile stress on the nanostructures 310b and 310a. The stress applied on the nanostructures 310b can equivalently increase the mobility of carriers (e.g., electrons) in the nanostructures 310b, which can in turn increase the conduction current of the pull-down transistor M2. Similar to the metal structure 324, the metals structure 322, extending into the access transistor M5's drain regions 312 by depth $D_1$, may apply or induce less compressive and/or tensile stress on the nanostructures 310a. As such, the stress applied on the access transistor M5's conduction channel (nanostructures 310a) is substantially less than the stress applied on the pull-down transistor M2's conduction channel (nanostructures 310b). Thus, the pull-down transistor M2 can conduct a conduction current substantially greater than a conduction current that the access transistor M5 can conduct.

FIG. 3B illustrates a cross-sectional view of the same partial cell 100' shown in FIG. 3A but formed based on the layout 230 of FIG. 2B. Thus, the cross-sectional view of FIG. 3B also includes the access transistor M5 and pull-down transistor M2 of the memory cell 100, which corresponds to a portion of the layout 230 cut along line B-B' (e.g., 231a, 206, 231b, 231c, 205, and 231d). For purposes of consistency, the reference numbers of FIG. 3A are again used in the discussion of FIG. 3B, which shall be focused on the difference between FIGS. 3A and 3B.

Different from FIG. 3A, the metal structure 324 in FIG. 3B includes two portions 324a and 324b. In some embodiments, the portion 324a may be formed using the contact feature 231b (FIG. 2B), and the portion 324b may be formed using the contact feature 231c (FIG. 2B). As such, the portion 324a can extend into the source/drain regions, 314 and 316, by a shallower depth (e.g., $D_1$), and the portion 324b can extend into the source/drain regions, 314 and 316, by a deeper depth (e.g., $D_2$). In this way, the pull-down transistor M2's conduction channel (nanostructures 310b), as shown in FIG. 3B, may be applied with even greater stress, when compared to the embodiment shown in FIG. 3A, which may further increase the conduction current of the pull-down transistor M2. It is appreciated that the access transistor M5's conduction channel (nanostructures 310a), as shown in FIG. 3B, may be applied with about the same level of stress, when compared to the embodiment shown in FIG. 3A.

FIG. 3C illustrates a cross-sectional view of the same partial cell 100' shown in FIGS. 3A-B but formed based on the layout 260 of FIG. 2C. Thus, the cross-sectional view of FIG. 3C also includes the access transistor M5 and pull-down transistor M2 of the memory cell 100, which corresponds to a portion of the layout 260 cut along line C-C' (e.g., 261a, 206, 261b, 205, and 261c). For purposes of consistency, the reference numbers of FIG. 3A are again used in the discussion of FIG. 3C, which shall be focused on the difference between FIGS. 3A and 3C.

Different from FIG. 3A, the metal structure 324 in FIG. 3C extend into the source/drain regions, 314 and 316 by $D_2$. In some embodiments, the metal structure of FIG. 3C may be formed using the contact feature 261b (FIG. 2C). In this way, the pull-down transistor M2's conduction channel (nanostructures 310b), as shown in FIG. 3B, may be applied with even greater stress, when compared to the embodiment shown in FIG. 3A, which may further increase the conduction current of the pull-down transistor M2. It is appreciated that the access transistor M5's conduction channel (nanostructures 310a), as shown in FIG. 3B, may also be applied with greater stress, when compared to the embodiment shown in FIG. 3A.

Figure 4:
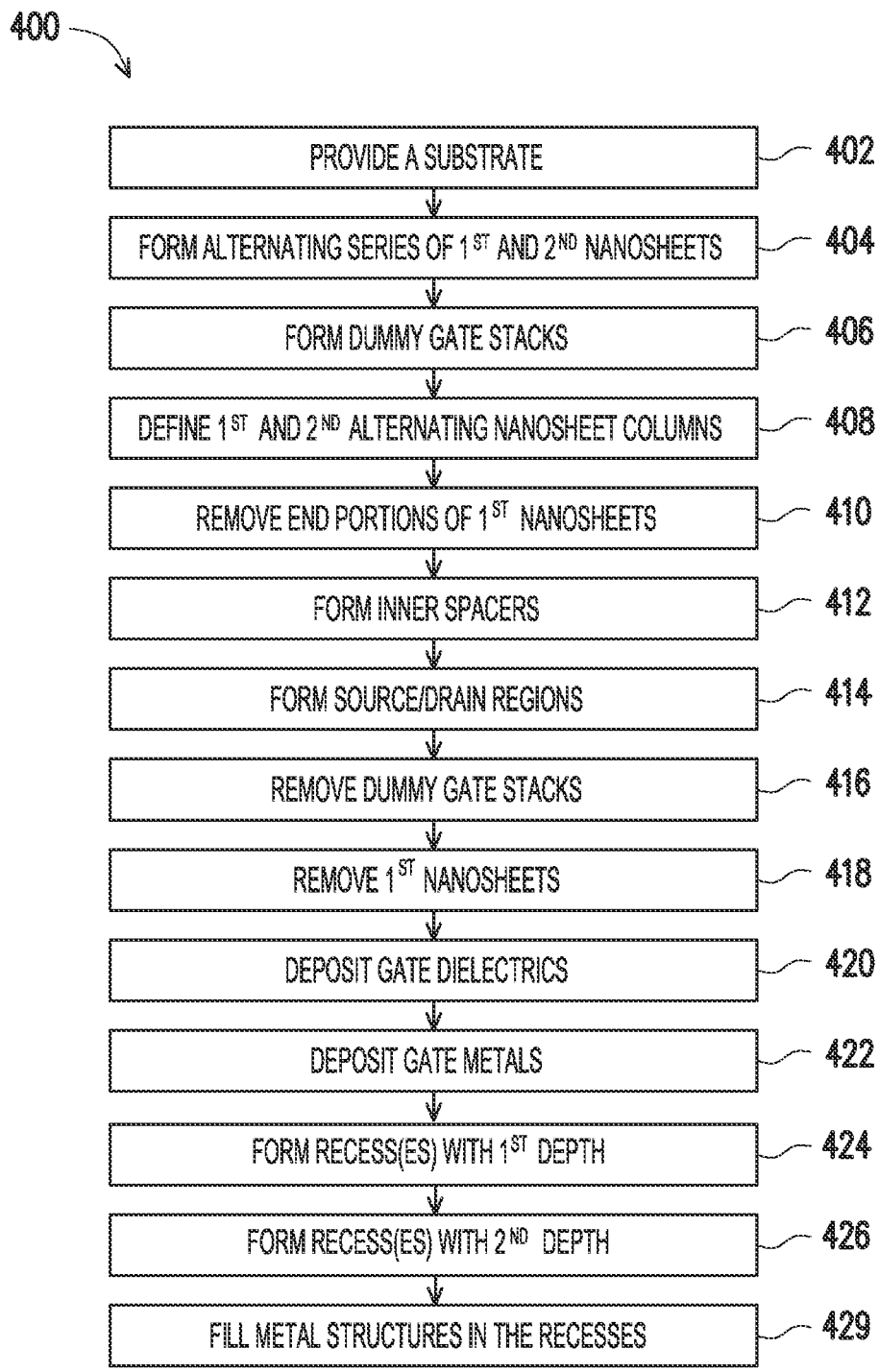
FIG. 4 illustrates a flow chart of a method for fabricating at least a portion of the memory cell of FIG. 1, in accordance with some embodiments.

FIG. 4 illustrates a flowchart of a method 400 to form a memory cell in a nanostructure transistor configuration, according to one or more embodiments of the present disclosure. For example, the method 400 can be used to form the memory cell 100 (FIG. 1) in a nanostructure transistor configuration. It is noted that the method 400 is merely an example and is not intended to limit the present disclosure. Accordingly, it is understood that additional operations may be provided before, during, and after the method 400 of FIG. 4, and that some other operations may only be briefly described herein.

Figure 5B:
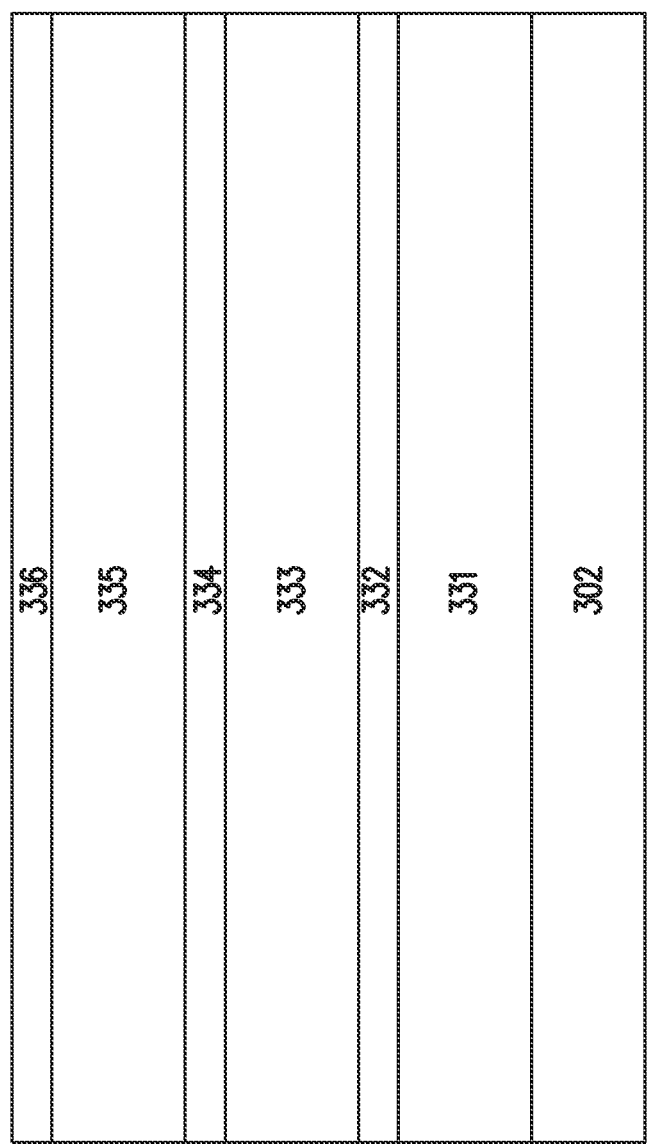

As a representative example, the operations of the method 400 may be associated with cross-sectional views of the partial cell 100' at respective fabrication stages as shown in FIGS. 5A, 5B, 5C, 5D, 5E, 5F, 5G, 5H, 5I, 5J, 5K, 5L, 5M, and 5N. In some embodiments, the partial cell 100', shown in FIGS. 5A-N, may correspond to the illustrated embodiment of FIG. 3A, and thus, the reference number of FIG. 3A are again used in FIGS. 5A-N. FIGS. 5A-N are simplified for a better understanding of the concepts of the present disclosure. It is appreciated that the method 400 can also be used to form the devices shown in FIGS. 3B and 3C, while remaining within the scope of the present disclosure.

Referring first to FIG. 4, in brief overview, the method 400 starts with operation 402 in which a substrate is provided. The method 400 proceeds to operation 404 in which an alternating series of first nanostructures and second nanostructures are formed. The method 400 proceeds to operation 406 in which a number of dummy gate stacks are formed. The method 4200 proceeds to operation 408 in which a first alternating-nanostructure column and a second alternating-nanostructure column are defined. The method 400 proceeds to operation 410 in which respective end portions of the first nanostructures are removed. The method 400 proceeds to operation 412 in which inner spacers are formed. The method 400 proceeds to operation 414 in which source regions and drain regions are formed. The method 400 proceeds to operation 416 in which the dummy gate stacks are removed. The method 400 proceeds to operation 418 in which the first nanostructures are removed. The method 400 proceeds to operation 420 in which gate dielectrics are deposited. The method 400 proceeds to operation 422 in which gate metal are deposited. The method 400 proceeds to operation 424 in which recess(es) with a first depth are formed. The method 400 proceeds to operation 426 in which recess(es) with a second depth are formed. The method 400 proceeds to operation 428 in which respective metal structures are filled in the recesses.

Corresponding to operation 402, FIG. 5A is a cross-sectional view of the partial cell 100' that includes the substrate 302, at one of the various stages of fabrication. The substrate 302 includes a semiconductor material substrate, for example, silicon. Alternatively, the substrate 302 may include other elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer. For example, the substrate may have an epitaxial layer overlying a bulk semiconductor. Furthermore, the substrate 302 may include a semiconductor-on-insulator (SOI) structure. For example, the substrate 302 may include a buried oxide (BOX) layer formed by a process such as separation by implanted oxygen (SIMOX) or other suitable technique, such as wafer bonding and grinding.

Corresponding to operation 404, FIG. 5B is a cross-sectional view of the partial cell 100' that includes an alternating series of first nanostructures 331, 333, and 335 and second nanostructures 332, 334, and 336, at one of the various stages of fabrication. The first nanostructures 331, 333, and 335 may include SiGe nanostructures (hereinafter "SiGe nanostructures 331, 333, and 335"), and the second nanostructures 332, 334, and 336 may include Si nanostructures (hereinafter "Si nanostructures 332, 334, and 336"). The alternating series of SiGe nanostructures 331, 333, and 335, and the Si nanostructures 332, 334, and 336 may be formed as a stack over the substrate 302, wherein the nanostructures 331-336 are disposed on top of one another along a vertical direction (e.g., the Z direction). Such a stack may sometimes be referred to as a superlattice. In a non-limiting example, the SiGe nanostructures 331, 333, and 335 can be SiGe 25%. The notation "SiGe 25%" is used to indicate that 25% of the SiGe material is Ge. It is understood the percentage of Ge in each of the SiGe nanostructures 331, 333, and 335 can be any value between 0 and 100 (excluding 0 and 100), while remaining within the scope of the present disclosure.

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si: C) silicon can be doped during deposition (in-situ doped) by adding dopants, n-type dopants (e.g., phosphorus or arsenic) or p-type dopants (e.g., boron or gallium), depending on the type of transistor.

Figure 5C:
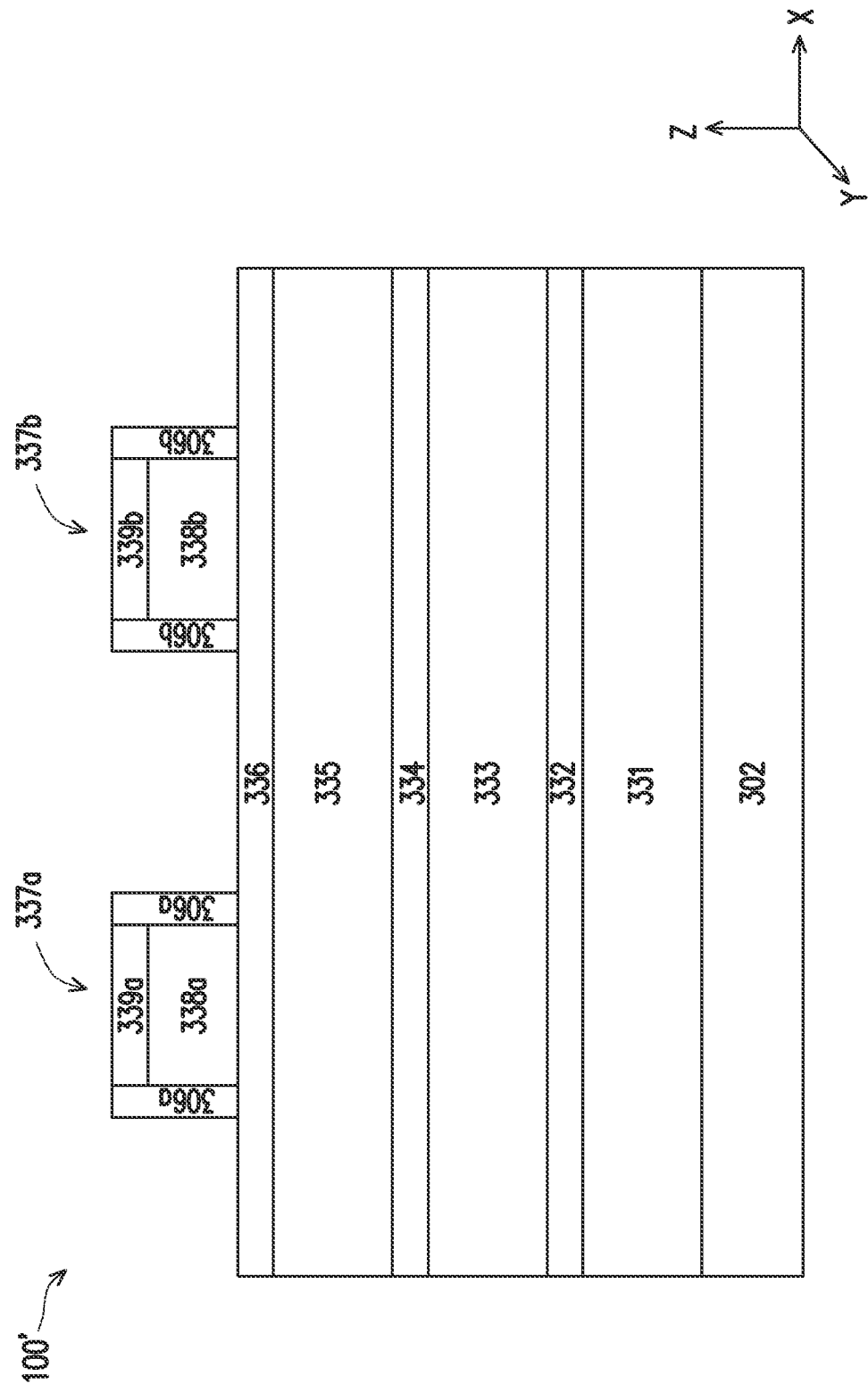

Corresponding to operation 406, FIG. 5C is a cross-sectional view of the partial cell 100' that includes a first dummy gate stack 337a and second dummy gate stack 337b, at one of the various stages of fabrication. Each of the dummy gate stacks, 337a-b, includes a dummy gate and a hard mask. For example in FIG. 5C, the first dummy gate stack 337a includes a dummy gate 338a formed over the Si nanostructure 336, and a hard mask 339a formed over the dummy gate 338a; and the second dummy gate stack 337b includes a dummy gate 338b formed over the Si nanostructure 336, and a hard mask 339b formed over the dummy gate 338b.

In some embodiments, the dummy gate stacks 337a-b may correspond to regions where the gates of the access transistor M5 and pull-down transistor M2 will be formed. For example, the dummy gate stacks 337a-b may correspond to the gate features 206 and 205 (FIG. 2A), respectively. Although each of the dummy gate stacks 337a-b is shown as a two-dimensional structure in FIG. 5C, it is appreciated that the dummy gate stacks 337a-b are each formed as a three-dimensional structure to straddle the alternating series of the nanostructures 331-336. For example, each of the dummy gate stacks 337a-b may be formed over and around sidewalls of the nanostructures 331-336. The dummy gates 338a-b can be formed by depositing amorphous silicon (a-Si) over and around the alternating series of nanostructures 31-336. The a-Si is then planarized to a desired level. A hard mask (not shown) is deposited over the planarized a-Si and patterned to form the hard masks 339a-b. The hard masks 339a-b can be formed from a nitride or an oxide layer. An etching process (e.g., a reactive-ion etching (RIE) process) is applied to the a-Si to form the dummy gate stacks 337a-b.

After forming the dummy gate stacks 337a-b, the offset gate spacers 306a and 306b (as shown in FIG. 3A) may be formed to extend along respective sidewalls of the dummy gate stacks 337a and 337b. The offset gate spacers 306a-b can be formed using a spacer pull down formation process. The offset gate spacers 306a-b can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE). Such offset gate spacers may sometimes be referred to as outer spacers.

Figure 5D:
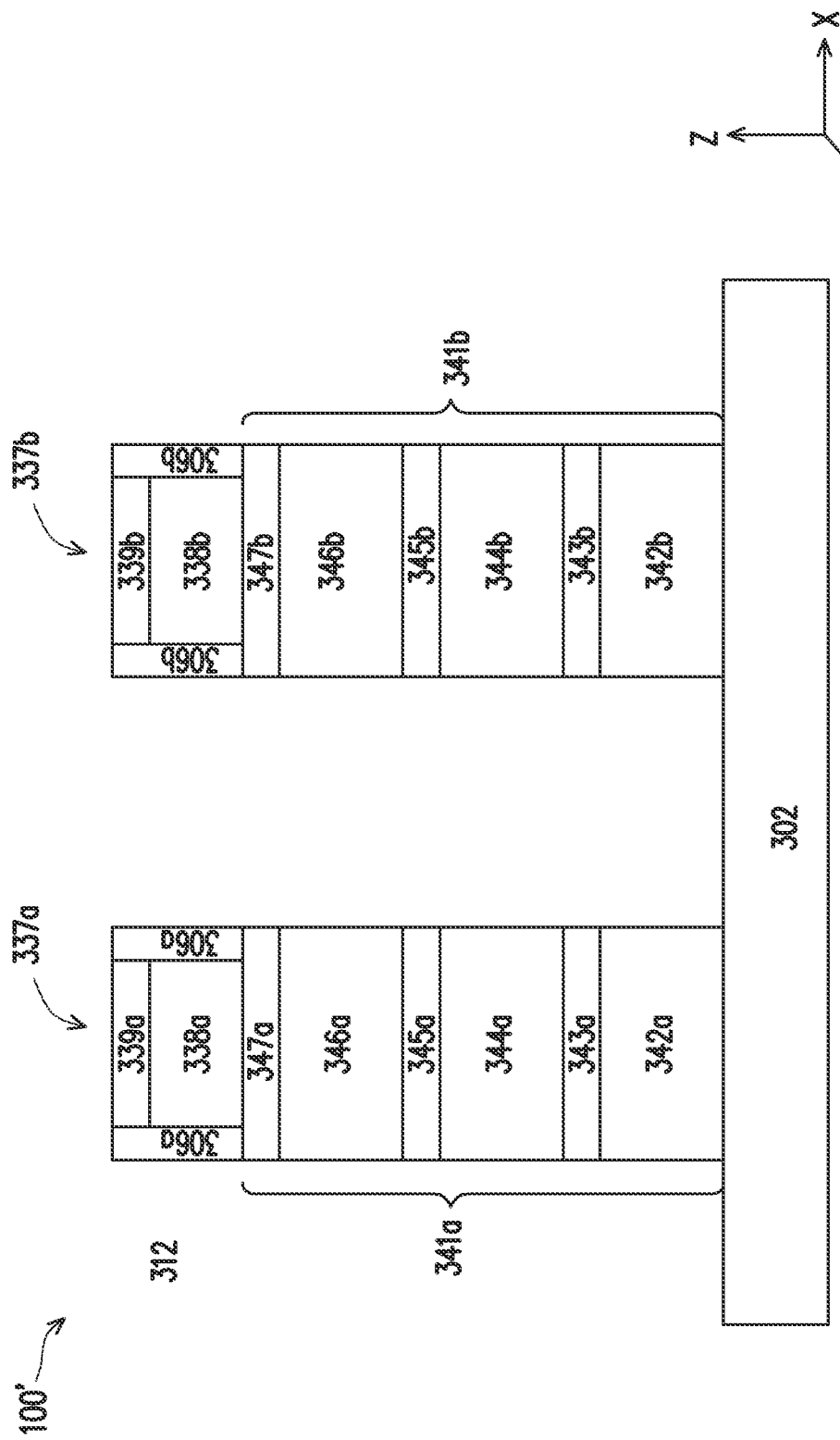

Corresponding to operation 408, FIG. 5D is a cross-sectional view of the partial cell 100' that includes alternating-nanostructure columns 341a and 341b, at one of the various stages of fabrication. Subsequently to forming the offset gate spacers 306a-b, the alternating-nanostructure columns 341a and 341b may be formed by at least some of the following processes: using the offset gate spacers 306a-b, the dummy gates 338a-b, and the hard masks 339a-b as a mask to define the footprint of the alternating-nanostructure columns 341a and 341b, and etching the alternating series of nanostructures 331-3369 (shown in FIG. 5C) to form the alternating-nanostructure columns 341a and 341b. As such, each of the alternating-nanostructure columns 341a and 341b includes a stack of alternating etched SiGe/Si nanostructures. For example, the alternating-nanostructure column 341a includes a stack of alternating etched SiGe nanostructure 342a, etched Si nanostructure 343a, etched SiGe nanostructure 344a, etched Si nanostructure 345a, etched SiGe nanostructure 346a, and etched Si nanostructure 347a; and the alternating-nanostructure column 341b includes a stack of alternating etched SiGe nanostructure 342b, etched Si nanostructure 343b, etched SiGe nanostructure 344b, etched Si nanostructure 345b, etched SiGe nanostructure 346b, and etched Si nanostructure 347b.

Corresponding to operation 410, FIG. 5E is a cross-sectional view of the partial cell 100', in which respective end portions of each of the etched SiGe nanostructures 352a-b, 354a-b, and 356a-b (shown in FIG. 5D) are removed, at one of the various stages of fabrication. The SiGe nanostructures 352a-b, 354a-b, and 356a-b may be later replaced by a number of gate stacks. Thus, the SiGe nanostructures 352a-b, 354a-b, and 356a-b may be herein referred to as "SiGe sacrificial nanostructures 352a-b, 354a-b, and 356a-b." The end portions of the etched SiGe nanostructures 352a-b, 354a-b, and 356a-b can be removed using a first application, so called a "pull-back" process to pull the etched SiGe nanostructures 352a-b, 354a-b, and 356a-b back an initial pull-back distance such that the ends of the SiGe sacrificial nanostructures 352a-b, 354a-b, and 356a-b respectively terminate underneath (e.g., aligned with) the offset gate spacers 306a-b. Although in the illustrated embodiment of FIG. 5E, the ends of each of the SiGe sacrificial nanostructures 352a-b, 354a-b, and 356a-b are approximately aligned with the inner sidewalls of the spacers 306a-b, it is understood that the pull-back distance (i.e., the extent to which each of the SiGe sacrificial nanostructures 352a-b, 354a-b, and 356a-b is etched, or pulled-back) can be arbitrarily increased or decreased. The pull-back process may include a hydrogen chloride (HCL) gas isotropic etch process, which etches SiGe without attacking Si.

Figure 5F:
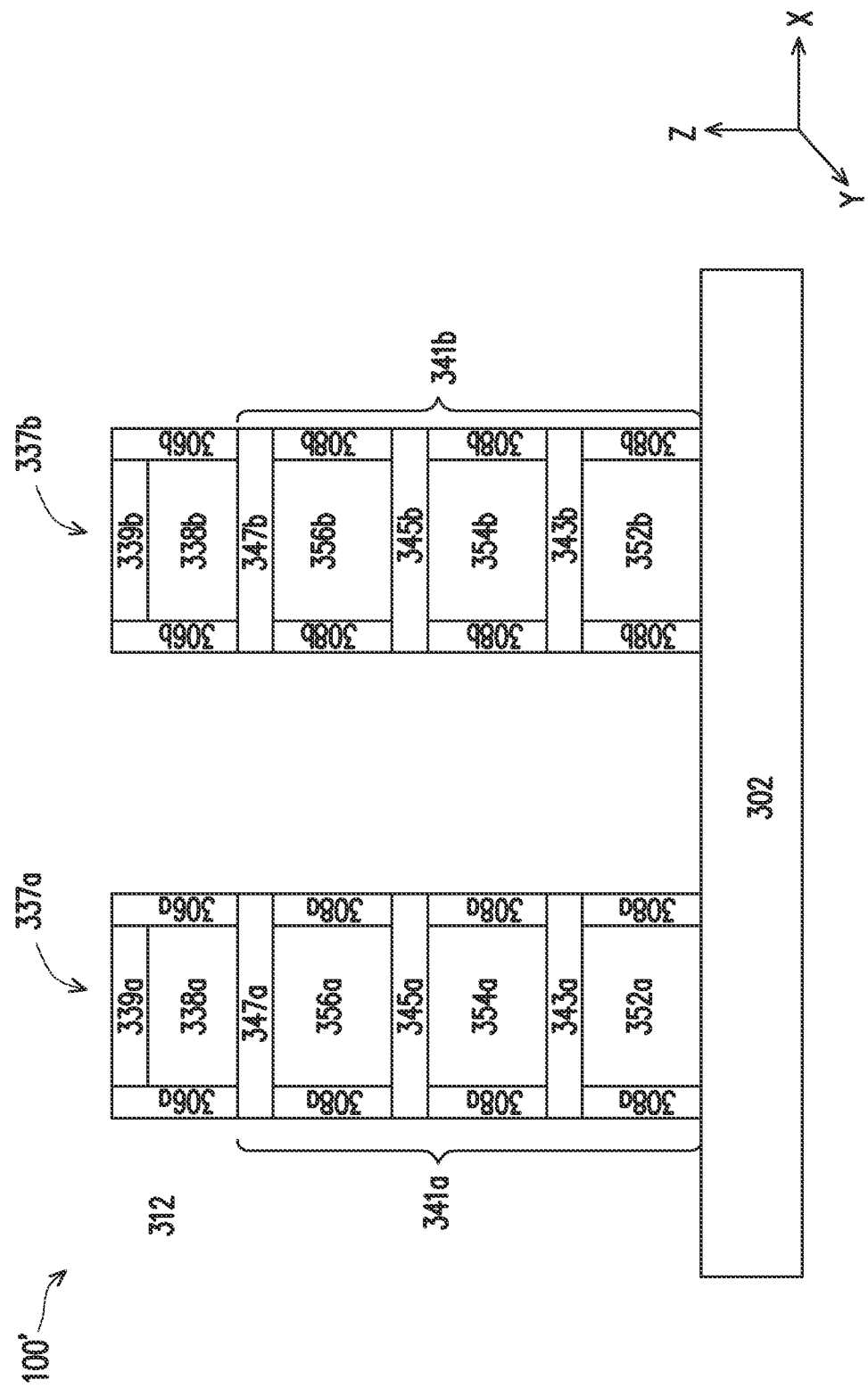

Corresponding to operation 412, FIG. 5F is a cross-sectional view of the partial cell 100' that includes the inner spacers 308a and 308b (as shown in FIG. 3A), at one of the various stages of fabrication. In some embodiments, the inner spacers 308a-b can be formed conformally by chemical vapor deposition (CVD), or by monolayer doping (MLD) of nitride followed by spacer RIE. In some other embodiments, the inner spacers 308a-b can be deposited using, e.g., a conformal deposition process and subsequent isotropic or anisotropic etch back to remove excess spacer material on vertical sidewalls of the alternating-nanostructure column 341a-b and on a surface of the semiconductor substrate 302. A material of the inner spacers 308a-b can be formed from the same or different material as the offset gate spacer 306a-b (e.g., silicon nitride). For example, the inner spacers 308a-b can be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of FET devices.

Figure 5G:
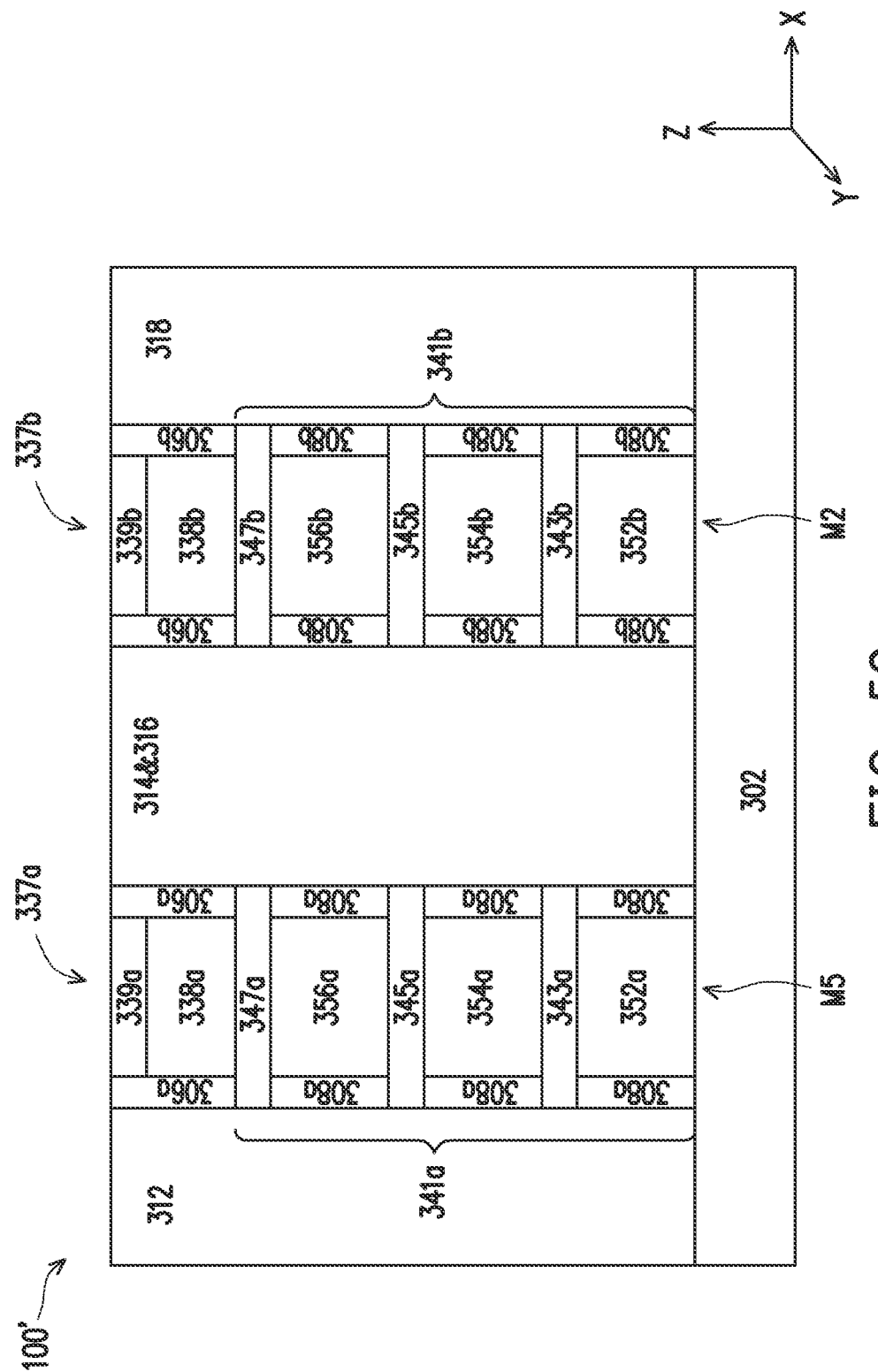

Corresponding to operation 414, FIG. 5G is a cross-sectional view of the partial cell 100' that includes the drain region 312, source region 314, drain region 316, and source region 318 (as shown in FIG. 3A), at one of the various stages of fabrication. In some embodiments, the drain region 312 may correspond to the section 201a (FIG. 2A); the source region 314 and drain region 316 may correspond to the section 201b (FIG. 2A); and the source region 318 may correspond to the section 201c (FIG. 2A). The drain region 312 may be formed using an epitaxial layer growth process on the exposed ends of the etched Si nanostructures 343a, 345a, and 347a on the left-hand side of the alternating-nanostructure column 341a. The source region 314 may be formed using an epitaxial layer growth process on the exposed ends of the etched Si nanostructures 343a, 345a, and 347a on the right-hand side of the alternating-nanostructure column 341a. The drain region 316 may be formed using an epitaxial layer growth process on the exposed ends of the etched Si nanostructures 343b, 345b, and 347b on the left-hand side of the alternating-nanostructure column 341b. The source 318 is formed using an epitaxial layer growth process on the exposed ends of the etched Si nanostructures 343b, 345b, and 347b on the right-hand side of the alternating-nanostructure column 341b. In some embodiments, the source region 314 and drain region 316 may be merged with each other to form a continuous feature or region, as shown in FIG. 5G.

According to some embodiments, the drain region 312 and source region 314 are electrically coupled to the Si nanostructures 343a, 345a, and 347a; and the drain region 316 and source region 318 are electrically coupled to the Si nanostructures 343b, 345b, and 347b. The Si nanostructures 343a, 345a, and 347a may collectively constitute a conduction channel of the access transistor M5; and the Si nanostructures 343b, 345b, and 347b may collectively constitute a conduction channel of the pull-down transistor M2.

In-situ doping (ISD) may be applied to form the doped drain/source regions 312-318, thereby creating the necessary junctions for the access transistor M5 and pull-down transistor M2. N-type and p-type FETs are formed by implanting different types of dopants to selected regions (e.g., drain/source regions 312-318) of the device to form the necessary junction(s). N-type devices can be formed by implanting arsenic (As) or phosphorous (P), and p-type devices can be formed by implanting boron (B).

Figure 5H:
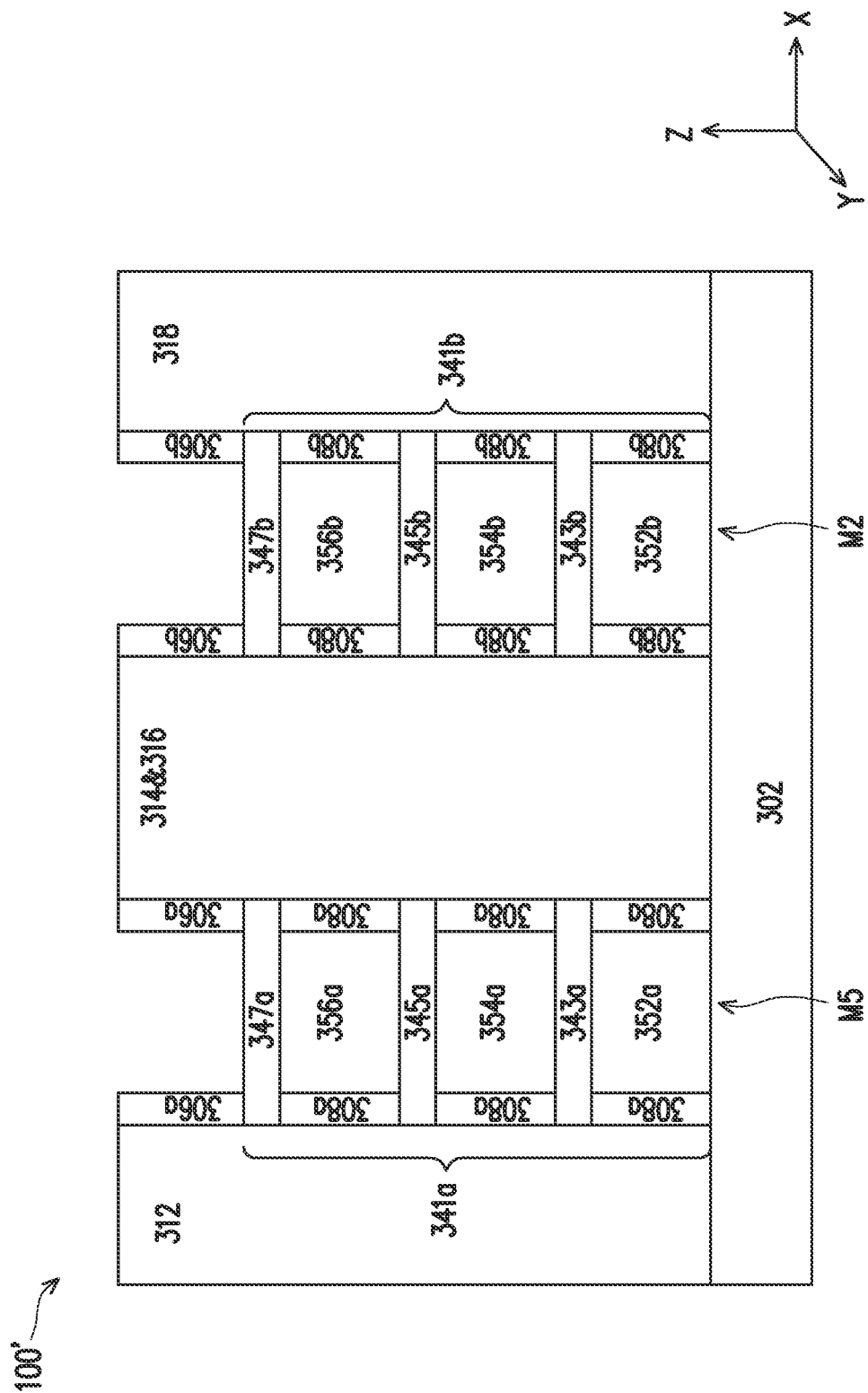
Figure 51:
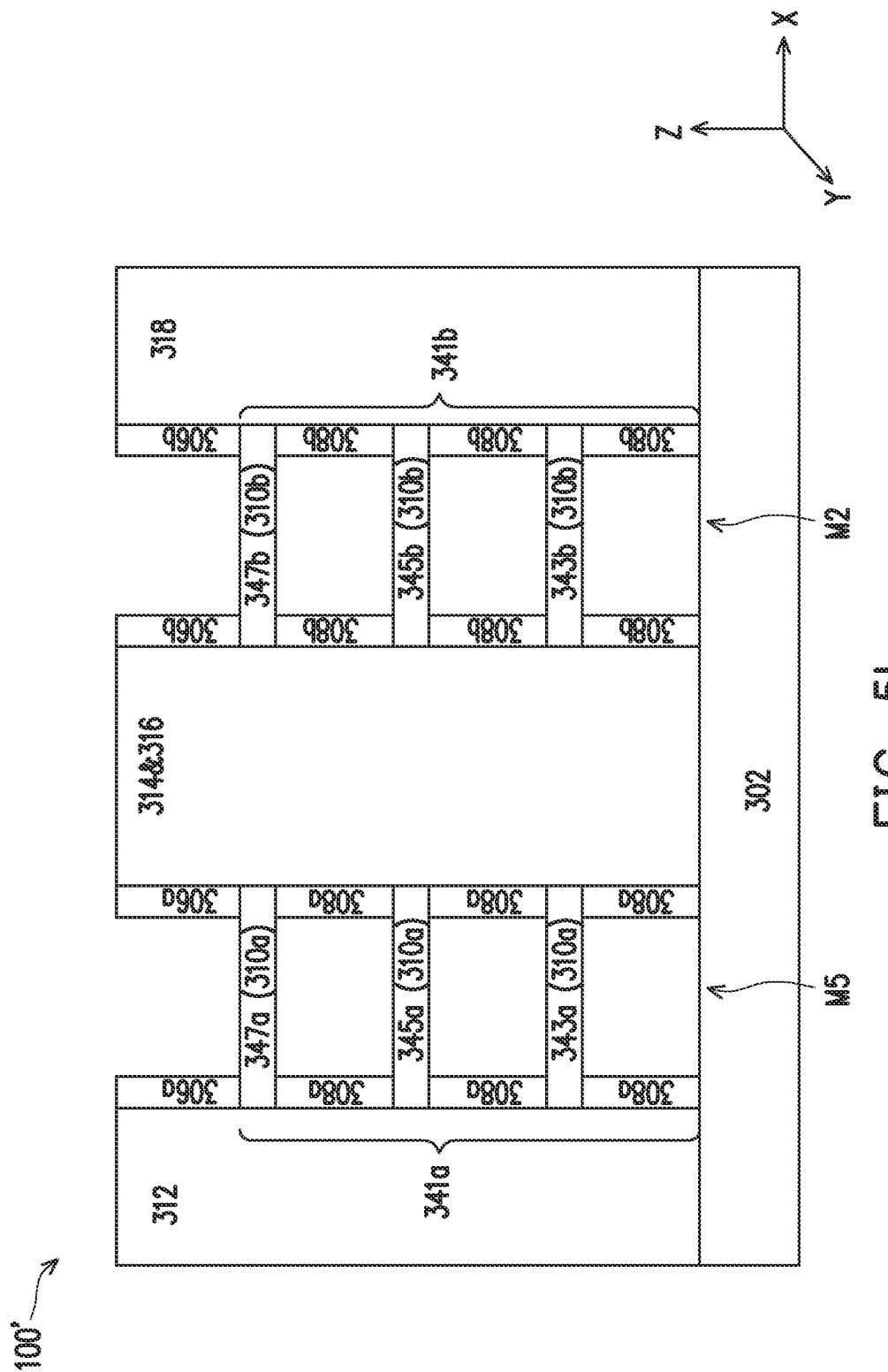

Corresponding to operation 416, FIG. 5H is a cross-sectional view of the partial cell 100' in which the dummy gate stacks 337a-b (FIG. 5G) are removed, at one of the various stages of fabrication. Subsequently to forming the source/drain regions 312-318, the dummy gate stacks 337a (including the dummy gate 338a and hard mask 339a) and 337b (including the dummy gate 338b and hard mask 339b), shown in FIG. 5G, are removed. The dummy gate stacks 337a-b can be removed by a known etching process, e.g., RIE or chemical oxide removal (COR).

After the removal of the dummy gate stacks 337a-b, respective top boundaries of the alternating-nanostructure columns 341a and 341b may be again exposed. Specifically, respective top boundaries of the etched Si nanostructures 347a of the alternating-nanostructure column 341a and the etched Si nanostructures 347b of the alternating-nanostructure column 341b may be exposed. Although not shown in the cross-sectional view of FIG. 5H, it is appreciated that in addition to the top boundaries, the respective sidewalls of the alternating-nanostructure columns 341a and 341b, facing along the Y direction, may also be exposed.

Corresponding to operation 222, FIG. 5I is a cross-sectional view of the partial cell 100' in which the SiGe sacrificial nanostructures 352a-b, 354a-b, and 356a-b (shown in FIG. 5H) are removed, at one of the various stages of fabrication. The SiGe sacrificial nanostructures 352a-b, 354a-b, and 356a-b can be removed by applying a selective etch (e.g., a hydrochloric acid (HCl)).

After the removal of the SiGe sacrificial nanostructures 352a-b, 354a-b, and 356a-b, respective bottom boundaries of the etched Si nanostructures 343a, 345a, and 347a of the alternating-nanostructure column 341a and the etched Si nanostructures 343b, 345b, and 347b of the alternating-nanostructure column 341b may be exposed. As mentioned above, the etched Si nanostructures 343a, 345a, and 347a of the alternating-nanostructure column 341a may be collectively configured as a conduction channel of the access transistor M5; and the etched Si nanostructures 343b, 345b, and 347b of the alternating-nanostructure column 341b may be collectively configured as a conduction channel of the pull-down transistor M2. As such, the etched Si nanostructures 343a, 345a, and 347a may herein be referred to as "conduction channel 310a" of the access transistor M5; and the etched Si nanostructures 343b, 345b, and 347b may herein be referred to as "conduction channel 310b" of the pull-down transistor M2. Although the conduction channels 310a-b are each constituted by three Si nanostructures, it is understood that each of the conduction channels 310a-b can be constituted by any number of nanostructures (e.g., one nanostructure, ten nanostructures) while remaining within the scope of the present disclosure.

Figure 5J:
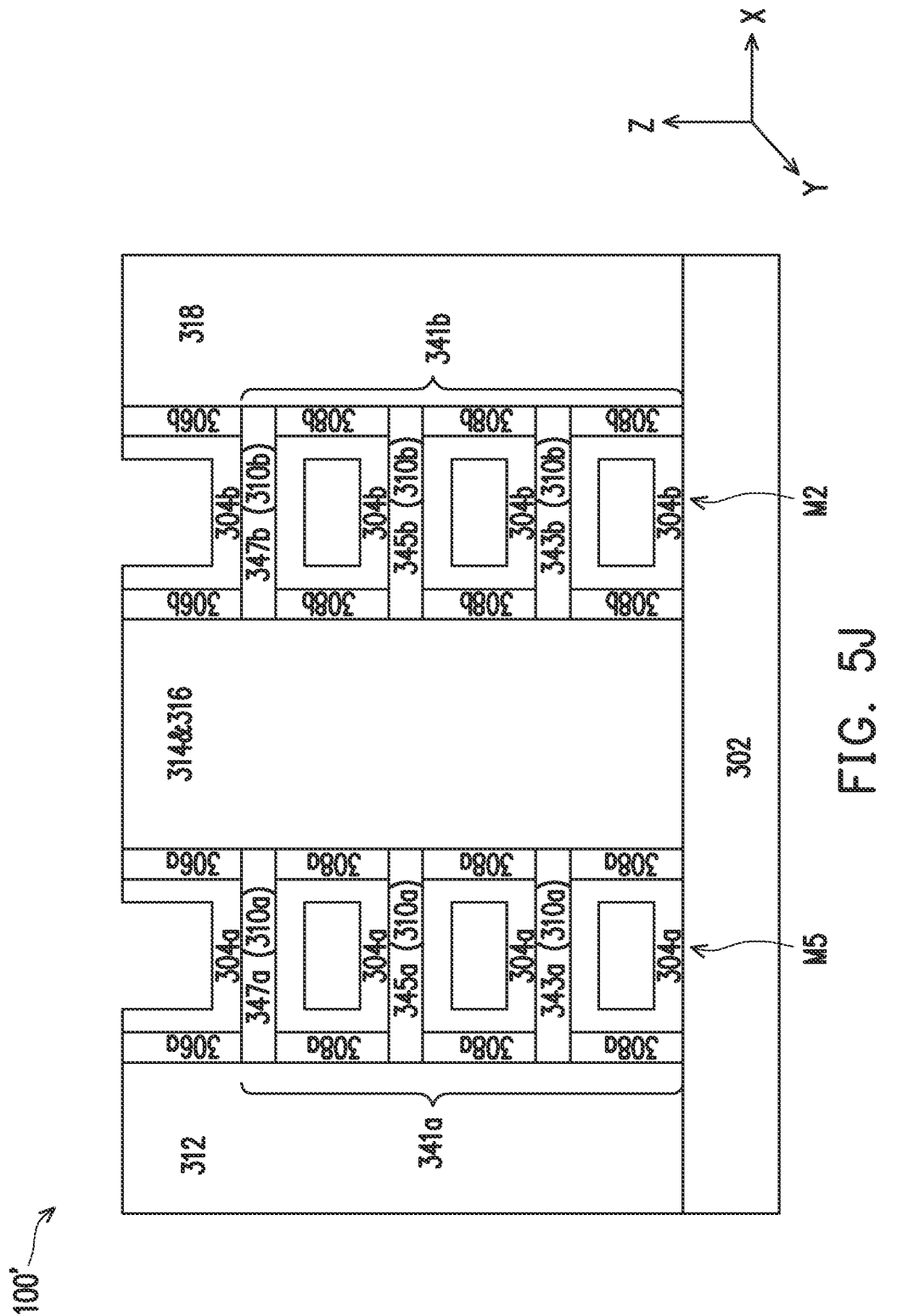

Corresponding to operation 420, FIG. 5J is a cross-sectional view of the partial cell 100' that includes the gate dielectrics 304a and 304b (as shown in FIG. 3A), at one of the various stages of fabrication. In some embodiments, the gate dielectric 304a can wrap around each of the Si nanostructures of the conduction channel 310a (the Si nanostructures 343a, 345a, and 347a); and the gate dielectric 304b can wrap around each of the Si nanostructures of the conduction channel 310b (the Si nanostructures 343b, 345b, and 347b). The gate dielectrics 304a and 304b may be formed of different high-k dielectric materials or an identical high-k dielectric material. The gate dielectrics 304a and 304b may include a stack of multiple high-k dielectric materials. The gate dielectrics 304a and 304b can be deposited using any suitable method, including, for example, atomic layer deposition (ALD). In some embodiments, the gate dielectrics 304a and 304b may optionally include a substantially thin oxide (e.g., $SiO_x$) layer.

Corresponding to operation 422, FIG. 5K is a cross-sectional view of the partial cell 100' that includes the gate metals 302a and 320b (as shown in FIG. 3A), at one of the various stages of fabrication. In some embodiments, the gate 302a can wrap around each of the Si nanostructures of the conduction channel 310a with the gate dielectric 304a disposed therebetween; and the gate 302b can wrap around each of the Si nanostructures of the conduction channel 310b with the gate dielectric 304b disposed therebetween. The gate metals 302a-b may be formed of different metal materials or an identical metal material. The gate metals 302a-b may each include a stack of multiple metal materials. The gate metals 302a-b can be deposited using any suitable method, including, for example, CVD.

Although the gate metals 302a-b are each shown as a two-dimensional structure in FIG. 5K, it is appreciated that the gate metals 302a-b are each formed as a three-dimensional structure. Specifically, the gate metals 302a-b can each include a number of gate metal sections spaced apart from each other along the Z direction. Each of the gate metal sections can extend not only along a horizontal plane (e.g., the plane expanded by the X direction and the Y direction), but also along a vertical direction (e.g., the Z direction). As such, two adjacent ones of the gate metal sections can adjoin each other so as to wrap around a corresponding Si nanostructure, with a gate dielectric disposed therebetween.

For example in FIG. 5K, the gate metal 302a can include gate metal sections 302a1, 302a2, 302a3, and 302a4. The gate metal sections 302a1 and 302a2 may adjoin together to wrap around the Si nanostructure 347a, with a portion of the gate dielectric 304a disposed therebetween. The gate metal sections 302a2 and 302a3 may adjoin together to wrap around the Si nanostructure 345a, with a portion of the gate dielectric 304a disposed therebetween. The gate metal sections 302a3 and 302a4 may adjoin together to wrap around the Si nanostructure 343a, with a portion of the gate dielectric 304a disposed therebetween. Similarly, the gate metal 302b can include gate metal sections 302b1, 302b2, 302b3, and 302b4. The gate metal sections 302b1 and 302b2 may adjoin together to wrap around the Si nanostructure 347b, with a portion of the gate dielectric 304b disposed therebetween. The gate metal sections 302b2 and 302b3 may adjoin together to wrap around the Si nanostructure 345b, with a portion of the gate dielectric 304b disposed therebetween. The gate metal sections 302b3 and 302b4 may adjoin together to wrap around the Si nanostructure 343b, with a portion of the gate dielectric 304b disposed therebetween. In some embodiments, such a gate metal section, together with the corresponding portion of the gate dielectric, that at least partially wrap around one of the Si nanostructures may be collectively referred to as a gate stack. The gate stack is operatively associated with the wrapped Si nanostructure (e.g., modulating the current conducting in the Si nanostructure). The gate stack may sometimes be referred to as an all-around gate stack.

In some embodiments, a number of gate stacks, constituted by the sections of the gate metal 302a and gate dielectric 304a, may function as a gate feature of the access transistor M5 to modulate the current conducting from the drain region 312, through the conduction channel 310a, and to the source region 314; and a number of gate stacks, constituted by the sections of the gate metal 302b and gate dielectric 304b, may function as a gate feature of the pull-down transistor M2 to modulate the current conducting from the drain region 316, through the conduction channel 310b, and to the source region 318.

Figure 5L:
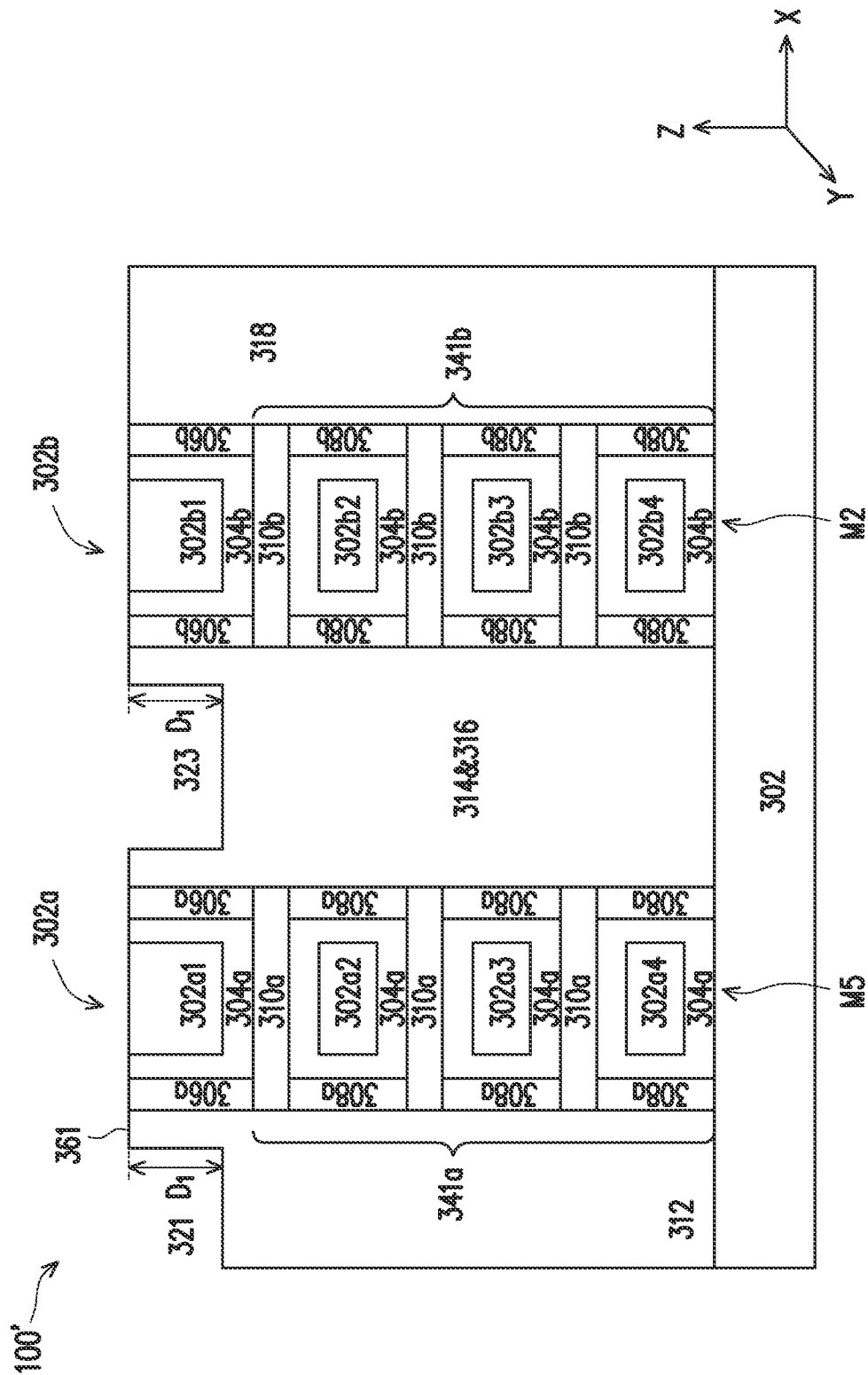

Corresponding to operation 424, FIG. 5L is a cross-sectional view of the partial cell 100' that includes the recesses 321 and 323 (as shown in FIG. 3A), at one of the various stages of fabrication. In some embodiments, the recesses 321 and 323 may correspond to the contact features 209a and 209b in FIG. 2A, respectively. For example, the recesses 321 and 323 may be formed by performing at least some of the following processes: forming a mask (e.g., a hard mask) based on the contact features 209a-b to expose the regions to form the recesses 321 and 323; performing an etching process (e.g., RIE) to etch, via the mask, the source/drain regions 312-316; and cleaning. In some embodiments, the recesses 321-323 may extend into the source/drain regions 312-316 by a depth, $D_1$, which may be defined as a distance measured from a top surface 361 of the source/drain regions 312-316 to a bottom surface 363 of the recesses 321-323. As mentioned above, the method 400 can also be used to form the devices shown in FIGS. 3B and 3C based on the layout 230 of FIG. 2B and layout 260 of FIG. 2C, respectively. In the example of FIGS. 3B (and 2B), two recesses, with the depth $D_1$, may be formed by performing at least some of the following processes: forming a mask (e.g., a hard mask) based on the contact features 231a-b to expose the regions to form the recesses; performing an etching process (e.g., RIE) to etch, via the mask, the source/drain regions 312-316; and cleaning. In the example of FIGS. 3C (and 2C), one recess, with the depth $D_1$, may be formed by performing at least some of the following processes: forming a mask (e.g., a hard mask) based on the contact feature 261a to expose the region to form the recess; performing an etching process (e.g., RIE) to etch, via the mask, the source/drain region 312; and cleaning.

Figure 5M:
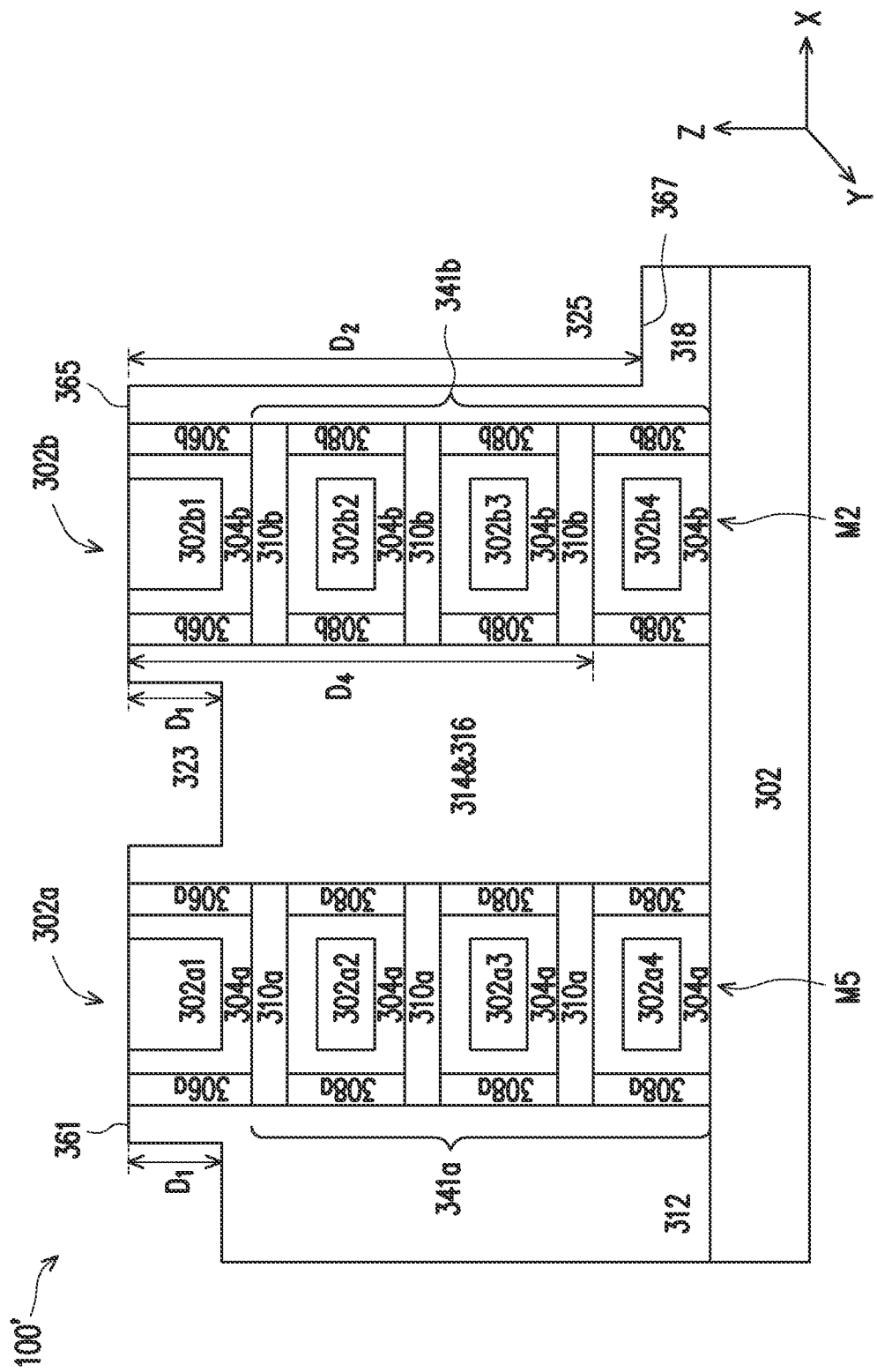
Figure 5N:
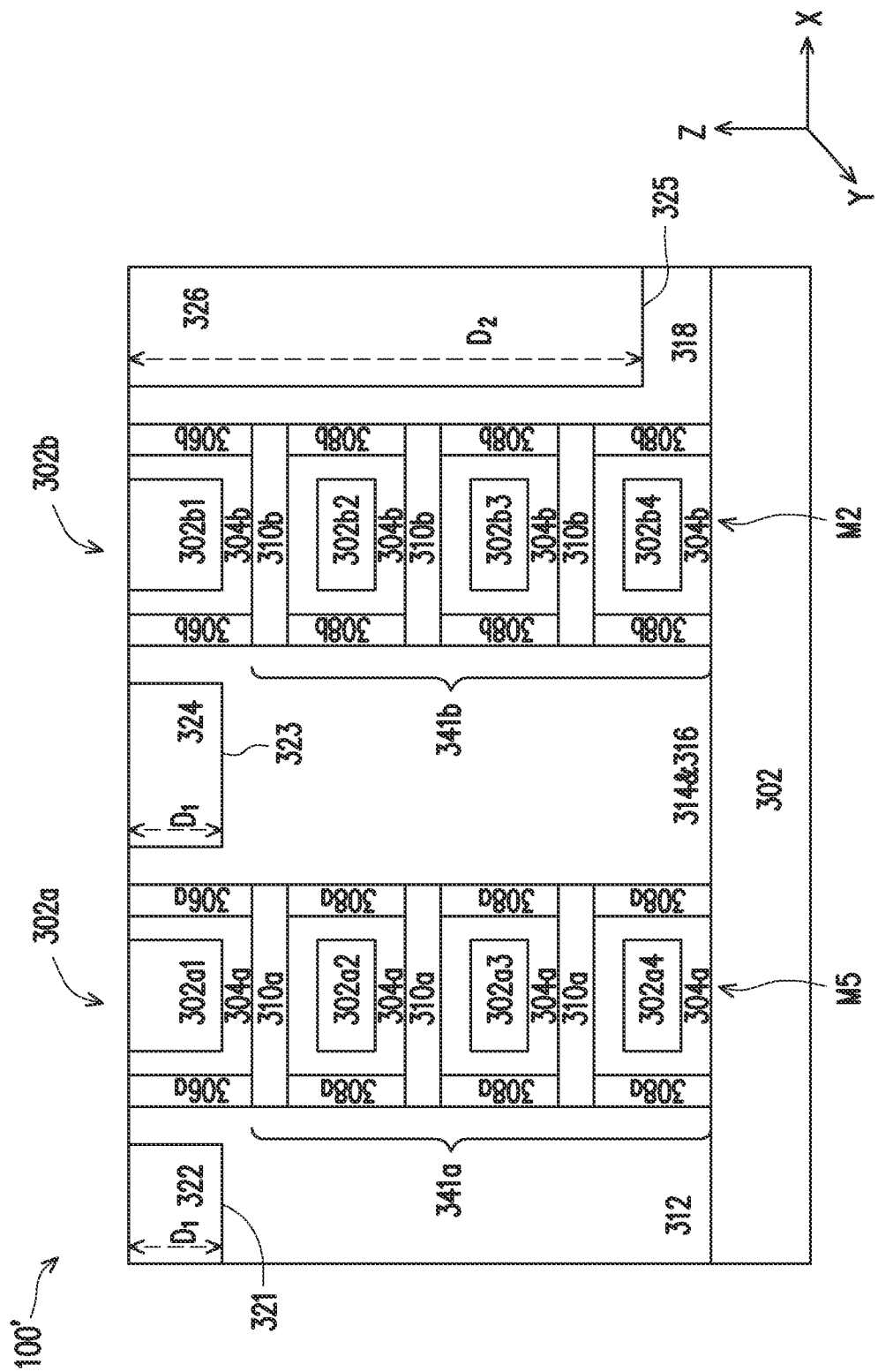

Corresponding to operation 426, FIG. 5M is a cross-sectional view of the partial cell 100' that includes the recess 325 (as shown in FIG. 3A), at one of the various stages of fabrication. In some embodiments, the recess 325 may correspond to the contact feature 209c in FIG. 2A. For example, the recess 325 may be formed by performing at least some of the following processes: forming a mask (e.g., a hard mask) based on the contact feature 209c to expose the region to form the recess 325; performing an etching process (e.g., RIE) to etch, via the mask, the source region 318; and cleaning. In some embodiments, the recess 325 may extend into the source region 318 by a depth, $D_2$, which may be defined as a distance measured from a top surface 365 of the source region 318 to a bottom surface 367 of the recess 325. In some embodiments, the top surface 365 of the source region 318 may be substantially coplanar with the top surface 361 of the drain/source regions 312-316. As such, the depth $D_1$ and $D_2$ may be measured from the same starting surface to respective ending surfaces. In some embodiments, $D_2$ is substantially greater than $D_1$. Further, in some embodiments, $D_2$ is greater than a distance, $D_4$, by which a farthest one of the nanostructures of the conduction channels 310a-b (e.g., the bottommost nanostructure wrapped by the metal sections 302b3 and 302b4) is spaced apart from the top surface 361. As mentioned above, the method 400 can also be used to form the devices shown in FIGS. 3B and 3C based on the layout 230 of FIG. 2B and layout 260 of FIG. 2C, respectively. In the example of FIGS. 3B (and 2B), two recesses, with the depth $D_2$, may be formed by performing at least some of the following processes: forming a mask (e.g., a hard mask) based on the contact features 231c-d to expose the regions to form the recesses; performing an etching process (e.g., RIE) to etch, via the mask, the source/drain regions 316-318; and cleaning. In the example of FIGS. 3C (and 2C), two recesses, with the depth $D_2$, may be formed by performing at least some of the following processes: forming a mask (e.g., a hard mask) based on the contact feature 261b-c to expose the regions to form the recesses; performing an etching process (e.g., RIE) to etch, via the mask, the source/drain regions 314-318; and cleaning.

Corresponding to operation 428, FIG. 5N is a cross-sectional view of the partial cell 100' that includes the metal structures 322, 324, and 326 (as shown in FIG. 3A), at one of the various stages of fabrication. The metal structures 322, 324, and 326 may be formed by respectively filling the recesses 321, 323, and 325 with a metal material (e.g., copper, tungsten). The metal structures 322-326 may be formed by performing at least some of the following processes: using any of a variety of deposition techniques (e.g., CVD, electroplating, e-beam, sputtering, etc.) to deposit the metal material over the recesses 321-325; polishing out excessive metal material until the top surface 365 is again exposed; and cleaning. As such, the metal structures 322-324 can inherit the same depth $D_1$ as the recesses 321-323, and the metal structure 326 can inherit the same depth $D_2$ as the recess 325.

In accordance with various embodiments of the present disclosure, the depth by which the metal structure extends into at least one of the drain/source regions of a pull-down transistor is greater than the depth by which the metal structure extends into at least one of the drain/source regions of a access transistor. For example in FIGS. 5N (and 3A), the metal structure 326 extends into one of the source/drain regions of the pull-down transistor M2 by the depth $D_2$, which is substantially greater than the depth $D_1$ by which the metal structures 322-324 extend into the source/drain regions 312-314 of the access transistor M2. As such, the conduction channel 310b of the pull-down transistor M2 can be applied with more stress than the conduction channel 310a of the access transistor M5.

Figure 6A:
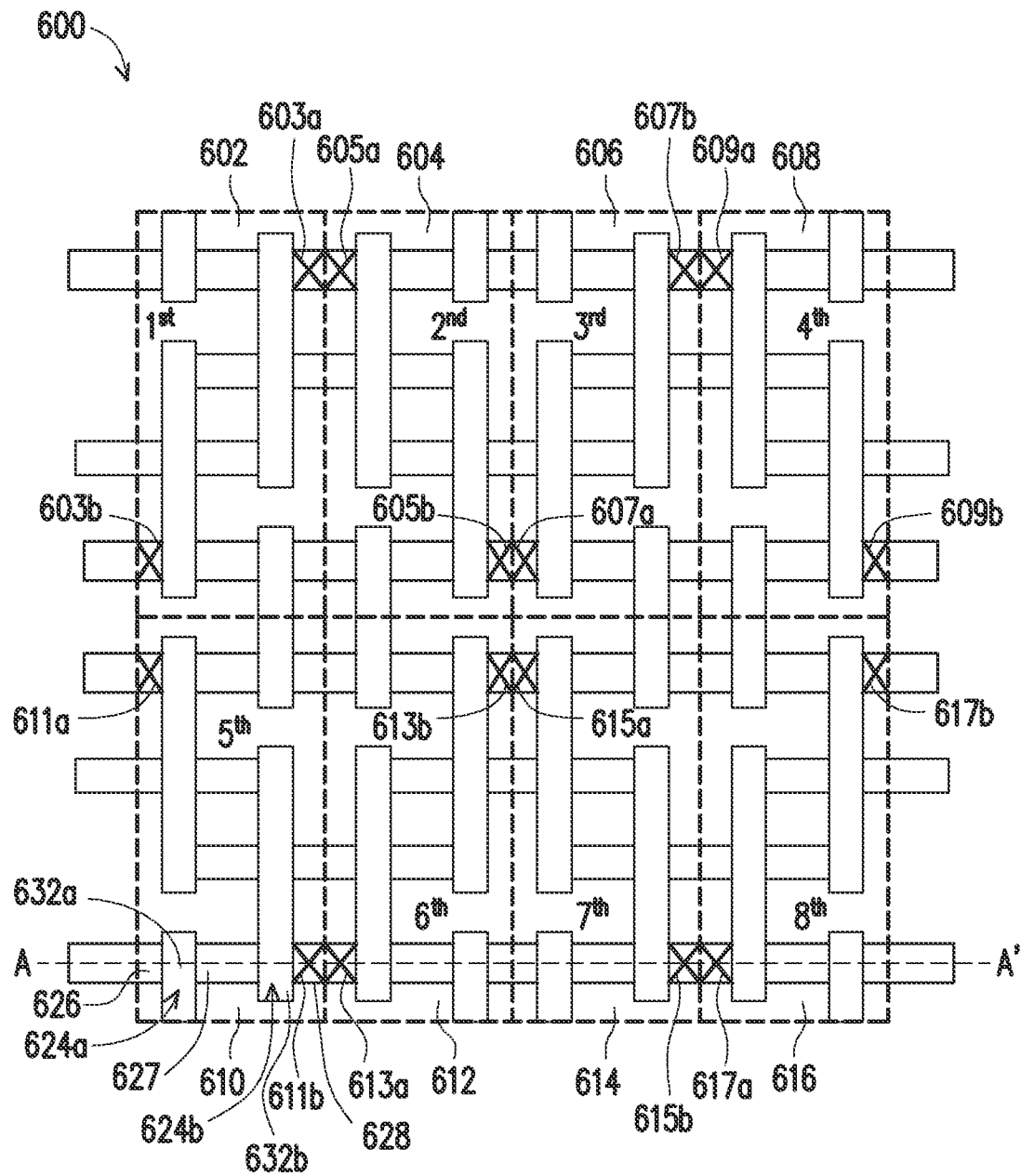
FIG. 6A illustrates an example design layout of a memory array, in accordance with some embodiments.

FIG. 6A illustrates an example circuit layout 600 of a portion of a memory array, in accordance with various embodiments. The portion includes 8 memory cells of the memory array, which may include a substantially greater number of memory cells. The layout 600 includes respective unit layouts for these 8 memory cells. For example, unit layout 602 corresponds to a $1^{st}$ memory cell; unit layout 604 corresponds to a $2^{nd}$ memory cell; unit layout 606 corresponds to a $3^{rd}$ memory cell; unit layout 608 corresponds to a $4^{th}$ memory cell; unit layout 610 corresponds to a $5^{th}$ memory cell; unit layout 612 corresponds to a $6^{th}$ memory cell; unit layout 614 corresponds to a $7^{th}$ memory cell; and unit layout 616 corresponds to an $8^{th}$ memory cell. In some embodiments, each of the unit layouts 602-616 is substantially similar to the layout 200 of FIG. 2A, and thus, discussion of the components (e.g., gate features, active features) of the layouts 602-616 are not repeated.

In some embodiments, these 8 unit layouts 602-616 are arranged in a column-row configuration, which corresponds to the arrangement of the 8 memory cells. For example, the $1^{st}$, $2^{nd}$, $3^{rd}$, and $4^{th}$ memory cells, respectively corresponding to the unit layouts 602-608, may be arranged along a first column and connected via a first bit line (BL); and the $5^{th}$, $6^{th}$, $7^{th}$, and $8^{th}$ memory cells, respectively corresponding to the unit layouts 610-616, may be arranged along a second BL and connected via a second BL. And, the $1^{st}$ and $5^{th}$ memory cells are arranged along a first row and connected via a first word line (WL); the $2^{nd}$ and $6^{th}$ memory cells are arranged along a second row and connected via a second WL; the $3^{rd}$ and $7^{th}$ memory cells are arranged along a third row and connected via a third WL; and the $4^{th}$ and $8^{th}$ memory cells are arranged along a fourth row and connected via a fourth WL.

Similar to the layouts discussed in FIGS. 2A-C, when utilizing the layout 600 to make the 1$^{st}$-8$^{th}$ memory cells, the pull-down transistors of each of the 1$^{st}$-8$^{th}$ memory cells include at least one relatively deep metal structure extending into the respective source/drain regions. As shown in FIG. 6A, the unit layout 602 includes contact features 603a and 603b (marked by symbol "X") configured to form metal structures extending into the source/drain regions of the pull-down transistors of the 1$^{st}$ memory cell by a relatively deep depth (e.g., similar as the metal structure 326 shown in FIGS. 3A-C); the unit layout 604 includes contact features 605a and 605b (marked by symbol "X") configured to form metal structures extending into the source/drain regions of the pull-down transistors of the 2$^{nd}$ memory cell by a relatively deep depth (e.g., similar as the metal structure 326 shown in FIGS. 3A-C); the unit layout 606 includes contact features 607a and 607b (marked by symbol "X") configured to form metal structures extending into the source/drain regions of the pull-down transistors of the 3$^{rd}$ memory cell by a relatively deep depth (e.g., similar as the metal structure 326 shown in FIGS. 3A-C); the unit layout 608 includes contact features 609a and 609b (marked by symbol "X") configured to form metal structures extending into the source/drain regions of the pull-down transistors of the 4$^{th}$ memory cell by a relatively deep depth (e.g., similar as the metal structure 326 shown in FIGS. 3A-C); the unit layout 610 includes contact features 611a and 611b (marked by symbol "X") configured to form metal structures extending into the source/drain regions of the pull-down transistors of the 5$^{th}$ memory cell by a relatively deep depth (e.g., similar as the metal structure 326 shown in FIGS. 3A-C); the unit layout 612 includes contact features 613a and 613b (marked by symbol "X") configured to form metal structures extending into the source/drain regions of the pull-down transistors of the 6$^{th}$ memory cell by a relatively deep depth (e.g., similar as the metal structure 326 shown in FIGS. 3A-C); the unit layout 614 includes contact features 615a and 615b (marked by symbol "X") configured to form metal structures extending into the source/drain regions of the pull-down transistors of the 7$^{th}$ memory cell by a relatively deep depth (e.g., similar as the metal structure 326 shown in FIGS. 3A-C); and the unit layout 616 includes contact features 617a and 617b (marked by symbol "X") configured to form metal structures extending into the source/drain regions of the pull-down transistors of the 8$^{th}$ memory cell by a relatively deep depth (e.g., similar as the metal structure 326 shown in FIGS. 3A-C). In some embodiments, the deep contact features of two adjacent unit layouts may merge together, for example, the contact feature 603a of the unit layout 602 and the contact feature 605a of the unit layout 604.

Figure 6B:
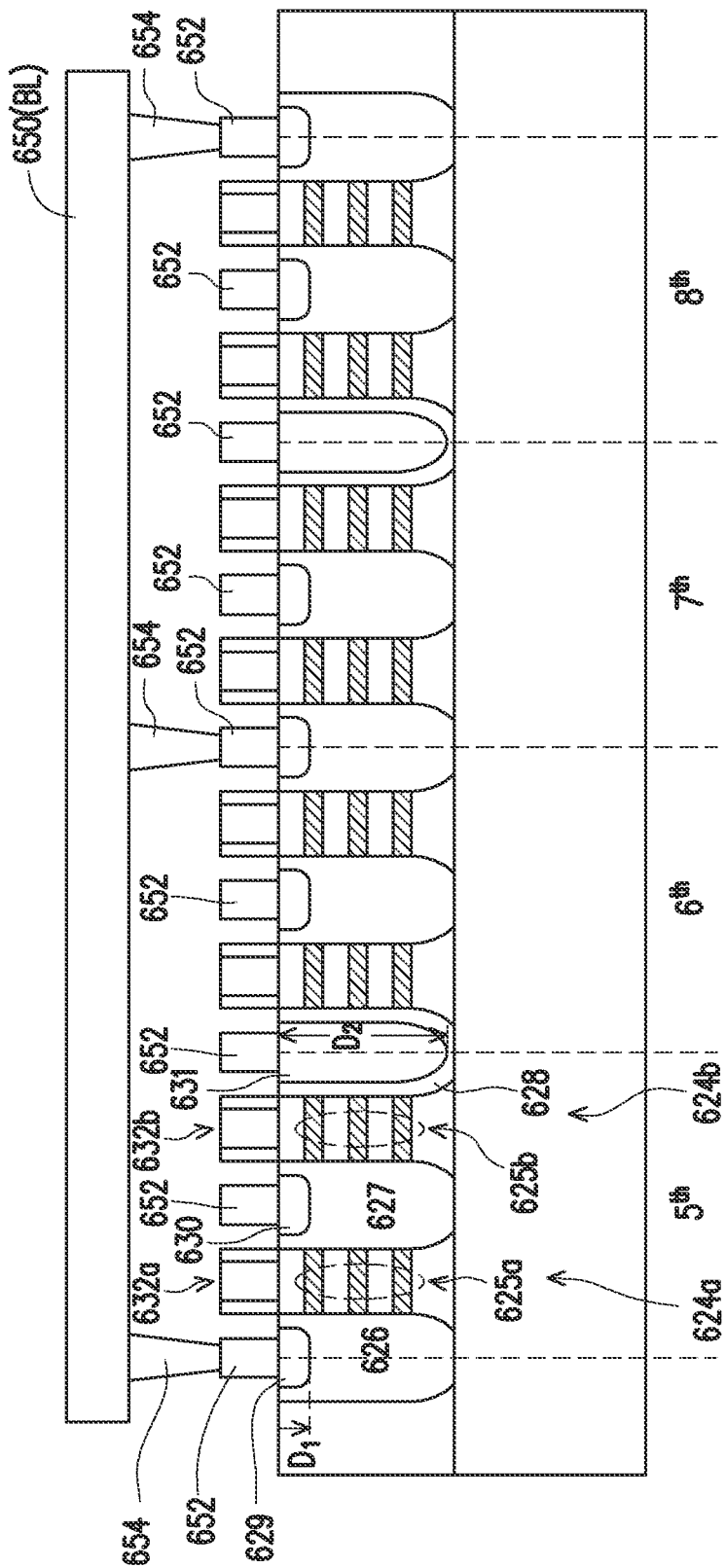
FIG. 6B illustrates a cross-sectional view of a portion of the memory array formed by the layout of FIG. 6A, in accordance with some embodiments.

FIG. 6B illustrates a cross-sectional view of a portion of the 1$^{st}$-8$^{th}$ memory cells, for example, the portion cut across line A-A' in FIG. 6A, which includes the respective access transistor and pull-down transistor of each of the 5$^{th}$-8$^{th}$ memory cells. As shown, the cross-sectional view of the partial 5$^{th}$-8$^{th}$ memory cells is substantially similar to the cross-sectional view of partial cell 100' shown in FIGS. 3A, and 5A-N. Thus, the cross-sectional view shown in FIG. 6B shall be briefly described as follows. The 5$^{th}$-8$^{th}$ memory cells are formed on a substrate 602, and the access transistor and pull-down transistor of each of the 5$^{th}$-8$^{th}$ memory cells are substantially similar to each other.

Using access transistor 624a and pull-down transistor 624b of the 5$^{th}$ memory cell as a representative example, the access transistor 624a includes a conduction channel (formed by one or more nanostructures) 625a, a drain region 626, a shared source/drain region 627, and a gate stack 632a; and the pull-down transistor 624b includes a conduction channel (formed by one or more nanostructures) 625b, the shared source/drain region 627, a source region 628, and a gate stack 632b. Further, each of the source/drain regions 626-628 includes a recess for the respective metal structure to extend therein. For example, metal structure 629 extends into the drain region 626 by a depth $D_1$, metal structure 630 extends into the shared source/drain region 637 by a depth $D_1$, and metal structure 631 extends into the source region 628 by a depth $D_2$. $D_2$ is substantially greater than $D_1$, in accordance with some embodiments.

As mentioned above, when arranging (e.g., connecting) a number of memory cells into an array, the memory cells may be connected to one another by respective BLs/WLs. As shown in FIG. 6B, the respective portions of the 5$^{th}$-8$^{th}$ memory cells are connected via a BL 650. Specifically, the BL 650 is electrically coupled to each of the 5$^{th}$-8$^{th}$ memory cells via one or more interconnection structures, made of a metal material (e.g., copper, tungsten). For example, the BL 650 is coupled to the source/drain region of the 5$^{th}$-8$^{th}$ memory cells via a first interconnection structure (which is typically referred to as an "MD" structure) 652 and a second interconnection structure 654 (which is typically referred to as a "VD" structure).

Although the above discussion is directed to the access transistor and pull-down transistor of an SRAM cell, it is appreciated that the methods/structures/layouts disclosed herein can apply to any of a variety of semiconductor devices that prefers to have a mismatch between the current levels of two different transistors while remaining within the scope of the present disclosure. Although the above discussion is directed to n-type transistors, it is also appreciated that the methods/structures/layouts disclosed herein can apply to other types of the transistors while remaining within the scope of the present disclosure. Using the memory cell 100 (FIG. 1) as an example, the metal structures with different depths may be formed to extend into the respective source/drain regions of the access transistor M5 and pull-up transistor M1 (which is a p-type transistor), where the depth by which the metal structure extends into the source/drain region of the access transistor M5 is substantially greater than the depth by which the metal structure extends into the pull-up transistor M1. As such, nanostructures of the access transistor M5 may be applied with greater stress when compared to nanostructures of the pull-up transistor M1, which can cause the access transistor M5 to conduct a higher level of current than the pull-up transistor M1.

In one aspect of the present disclosure, a semiconductor device is disclosed. The semiconductor device includes a plurality of first nanostructures stacked on top of one another. The semiconductor device includes a plurality of first all-around gate stacks operatively associated with the plurality of first nanostructures. The semiconductor device includes a plurality of second nanostructures stacked on top of one another. The semiconductor device includes a plurality of second all-around gate stacks operatively associated with the plurality of second nanostructures. The semiconductor device includes a first drain/source region electrically coupled to a first end of the first nanostructures. The first drain/source region includes a first recess with a first depth. The semiconductor device includes a second drain/source region electrically coupled to a second end of the first nanostructures. The second drain/source region includes a second recess with a second depth. The semiconductor device includes a third drain/source region electrically coupled to a first end of the second nanostructures. The third drain/source region includes a third recess with a third depth. The semiconductor device includes a fourth drain/source region electrically coupled to a second end of the second nanostructures. The fourth drain/source region includes a fourth recess with a fourth depth. At least one of the first depth, second depth, third depth, or fourth depth is greater than a distance by which a farthest one of the plurality of first nanostructures and the plurality of second nanostructures is spaced apart from a top surface of the first drain/source region, the second drain/source region, the third drain/source region, and the fourth drain/source region.

In another aspect of the present disclosure, a memory cell is disclosed. The memory cell includes a first transistor. The first transistor includes a first conduction channel collectively constituted by one or more first nanostructures spaced apart from one another along a vertical direction. The memory cell includes a second transistor electrically coupled to the first transistor in series. The second transistor includes a second conduction channel collectively constituted by one or more second nanostructures spaced apart from one another along the vertical direction. At least one of the one or more first nanostructures is applied with first stress by a first metal structure extending, along the vertical direction, into a first drain/source region of the first transistor.

In yet another aspect of the present disclosure, a method for fabricating a semiconductor device is disclosed. The method includes forming a first stack over a substrate. The first stack includes one or more first nanostructures spaced apart from one another along a vertical direction. The method includes forming a second stack over the substrate. The second stack includes one or more second nanostructures spaced apart from one another along the vertical direction. The method includes growing a first drain/source region and a second drain/source region on respective ends of the one or more first nanostructures. The method includes growing a third drain/source region and a fourth drain/source region on respective ends of the one or more second nanostructures. The method includes forming a first metal structure extending into the first drain/source region and a second metal structure extending into the second drain/source region. The first and second metal structures are characterized with a first depth. The method includes forming a third metal structure extending into the third drain/source region and a fourth metal structure extending into the fourth drain/source region, the third metal structure characterized with the first depth. The fourth metal structure is characterized with a second, different depth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of memory cells arranged over a plurality of rows and a plurality of columns;
wherein each of the plurality of memory cells comprises:
a first pull-down transistor; and
a second pull-down transistor;
wherein the first pull-down transistor has at least one first source/drain region in connection with a first contact extending from a top surface of the first source/drain region into the first source/drain region with a first depth, and the second pull-down transistor has at least one second source/drain region in connection with a second contact extending from a top surface of the second source/drain region into the second source/drain region with a second depth, the first depth and second depth being greater than a depth of a contact in connection with any other transistor included in the corresponding memory cell.

2. The memory device of claim 1, wherein the first and second pull-down transistors are configured to provide a first discharge path and a second discharge path, respectively, in response to the corresponding memory cell being accessed.

3. The memory device of claim 1, wherein the first pull-down transistor includes a first conduction channel, and the second pull-down transistor includes a second conduction channel.

4. The memory device of claim 3, wherein the first conduction channel includes a plurality of first nanostructures, each of which is wrapped around by a first gate stack, and wherein the second conduction channel includes a plurality of second nanostructures, each of which is wrapped around by a second gate stack.

5. The memory device of claim 4, wherein the first and second gate stacks each extend along a first lateral direction, and the pluralities of first and second nanostructures each extend along a second lateral direction, the first lateral direction being perpendicular to the second lateral direction.

6. The memory device of claim 3, wherein the at least one first source/drain region is in connection with the first conduction channel, and the at least one second source/drain region is in connection with the second conduction channel.

7. The memory device of claim 1, wherein a first one of the plurality of memory cells and a second one of the plurality of memory cells are disposed next to each other along one of the columns and along respective ones of the rows.

8. The memory device of claim 7, wherein one of its first pull-down transistor or second pull-down transistor of the first memory cell is disposed next to one of its first pull-down transistor or second pull-down transistor of the second memory cell.

9. A memory device, comprising:
a plurality of memory cells arranged across a plurality of rows and a plurality of columns;
wherein a first one of the memory cells is arranged at an intersection of one of the columns and a first one of the rows, and a second one of the memory cells is arranged at an intersection of the same column and a second one of the rows;
wherein the first memory cell includes a first pull-down transistor and a second pull-down transistor, the first pull-down transistor and second pull-down transistor each having at least one of its metal contacts with a first depth extending into any of the first pull-down transistor and the second pull-down transistor from a top surface thereof greater than a depth of a metal contact extending into any other transistor included in the first memory cell; and
wherein the second memory cell includes a third pull-down transistor and a fourth pull-down transistor, the third pull-down transistor and fourth pull-down transistor each having at least one of its metal contacts with a second depth extending into any of the third pull-down transistor and the fourth pull-down transistor from a top surface thereof greater than a depth of a metal contact extending into any other transistor included in the second memory cell.

10. The memory device of claim 9, wherein the first memory cell and the second memory cell are disposed next to each other, with one of the first pull-down transistor or second pull-down transistor disposed next to one of the third pull-down transistor or fourth pull-down transistor.

11. The memory device of claim 9, wherein a third one of the memory cells is arranged at an intersection of the same column and a third one of the rows, and wherein the third memory cell includes a fifth pull-down transistor and a sixth pull-down transistor, the fifth pull-down transistor and sixth pull-down transistor each having at least one of its metal contacts with a third depth extending into any of the fifth pull-down transistor and the sixth pull-down transistor from a top surface thereof greater than a depth of a metal contact extending into any other transistor included in the third memory cell.

12. The memory device of claim 11, wherein the second memory cell and the third memory cell are disposed next to each other, with one of the third pull-down transistor or fourth pull-down transistor disposed next to one of the fifth pull-down transistor or sixth pull-down transistor.

13. The memory device of claim 9, wherein the first pull-down transistor includes a first conduction channel, the second pull-down transistor includes a second conduction channel, the third pull-down transistor includes a third conduction channel, and the fourth pull-down transistor includes a fourth conduction channel.

14. The memory device of claim 13, wherein the first conduction channel includes a plurality of first nanostructures, each of which is wrapped around by a first gate stack, wherein the second conduction channel includes a plurality of second nanostructures, each of which is wrapped around by a second gate stack, wherein the third conduction channel includes a plurality of third nanostructures, each of which is wrapped around by a third gate stack, and wherein the fourth conduction channel includes a plurality of fourth nanostructures, each of which is wrapped around by a fourth gate stack.

15. The memory device of claim 13, wherein the first and second pull-down transistors are configured to provide a first discharge path and a second discharge path, respectively, in response to the first memory cell being accessed, and wherein the third and fourth pull-down transistors are configured to provide a third discharge path and a fourth discharge path, respectively, in response to the second memory cell being accessed.

16. A memory device, comprising:
a plurality of memory cells arranged across a plurality of rows and a plurality of columns;
wherein a first one of the memory cells is arranged at an intersection of one of the columns and a first one of the rows, and a second one of the memory cells is arranged at an intersection of the same column and a second one of the rows;
wherein the first memory cell includes at least a first pull-down transistor, the first pull-down transistor having at least one of its metal contacts with a first depth extending into the first pull-down transistor, the first depth being greater than a depth of a metal contact of another transistor included in the first memory cell; and
wherein the second memory cell includes at least a second pull-down transistor, the second pull-down transistor having at least one of its metal contacts with a second depth extending into the second pull-down transistor, the second depth being greater than a height of a metal contact of another transistor included in the second memory cell.

17. The memory device of claim 16, wherein the first memory cell and the second memory cell are disposed next to each other, with the first pull-down transistor disposed next to the second pull-down transistor.

18. The memory device of claim 16, wherein the first pull-down transistor includes a first conduction channel, the second pull-down transistor includes a second conduction channel.

19. The memory device of claim 18, wherein the first conduction channel includes a plurality of first nanostructures, each of which is wrapped around by a first gate stack, wherein the second conduction channel includes a plurality of second nanostructures, each of which is wrapped around by a second gate stack.

20. The memory device of claim 16, wherein the first pull-down transistor is configured to provide a first discharge path, in response to the first memory cell being accessed, and wherein the second pull-down transistor is configured to provide a second discharge path, in response to the second memory cell being accessed.

* * * * *